United States Patent
Phan

(10) Patent No.: US 9,305,655 B2
(45) Date of Patent: Apr. 5, 2016

(54) SOLVING MLC NAND PAIRED PAGE PROGRAM USING REDUCED SPATIAL REDUNDANCY

(71) Applicants: Lan Dinh Phan, Trabuco Canyon, CA (US); Virtium Technology, Inc., Rancho Santa Margarita, CA (US)

(72) Inventor: Lan Dinh Phan, Trabuco Canyon, CA (US)

(73) Assignee: Virtium Technology, Inc., Rancho Santa Margarita, CA (US)

( * ) Notice: Subject to any disclaimer, the term of this patent is extended or adjusted under 35 U.S.C. 154(b) by 189 days.

(21) Appl. No.: 14/038,749

(22) Filed: Sep. 27, 2013

(65) Prior Publication Data

US 2015/0092487 A1    Apr. 2, 2015

(51) Int. Cl.
| | |
|---|---|
| G11C 14/00 | (2006.01) |
| G06F 3/00 | (2006.01) |
| G11C 16/22 | (2006.01) |
| G06F 3/06 | (2006.01) |
| G11C 11/56 | (2006.01) |
| G11C 29/00 | (2006.01) |

(52) U.S. Cl.
CPC ............. *G11C 16/225* (2013.01); *G06F 3/06* (2013.01); *G11C 11/5628* (2013.01); *G11C 29/822* (2013.01)

(58) Field of Classification Search
CPC .................................................. G11C 16/225
USPC .................................................. 711/103
See application file for complete search history.

(56) References Cited

U.S. PATENT DOCUMENTS

| | | | |
|---|---|---|---|
| 6,988,175 B2 | 1/2006 | Lasser | |
| 7,275,140 B2 | 9/2007 | Paley | |
| 8,694,720 B2 * | 4/2014 | Lee et al. | 711/103 |
| 8,966,163 B2 * | 2/2015 | Joo | 711/103 |
| 2003/0115518 A1 * | 6/2003 | Kleveland et al. | 714/718 |
| 2004/0268063 A1 * | 12/2004 | Lasser | 711/154 |
| 2013/0173848 A1 * | 7/2013 | Lassa et al. | 711/103 |
| 2013/0304966 A1 * | 11/2013 | Joo | 711/103 |
| 2014/0201428 A1 * | 7/2014 | Kirazci et al. | 711/103 |

* cited by examiner

*Primary Examiner* — Vanthu Nguyen
*Assistant Examiner* — Jerome Leboeuf

(57) ABSTRACT

Reduced spatial redundancy of lower bits data provides data protection for a flash memory having MLC NAND devices operated in page mode. An interrupted write operation of most significant bit pages can corrupt previously written data in lower bit pages. The lower bits redundant memory assists in restoring the data, using less than a full back up storage.

20 Claims, 14 Drawing Sheets

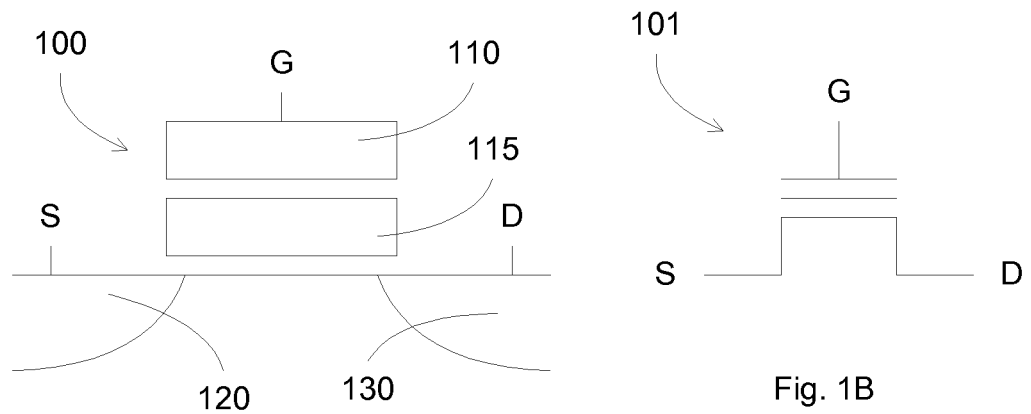
Fig. 1A
Fig. 1B
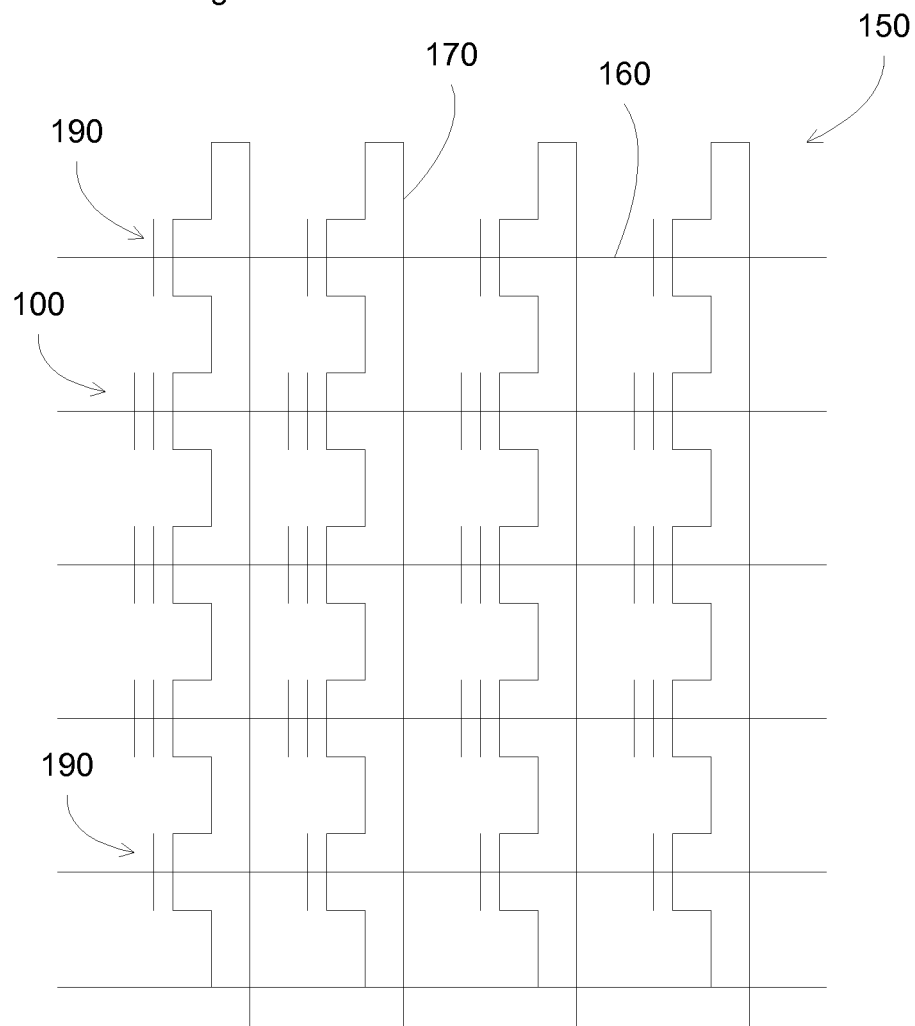
Fig. 1C

Forming a redundant memory array for a main memory array, wherein the redundant memory array is configured to contain a mirror image of the least significant bits (LSB) of the main memory array
1000
Fig. 10A
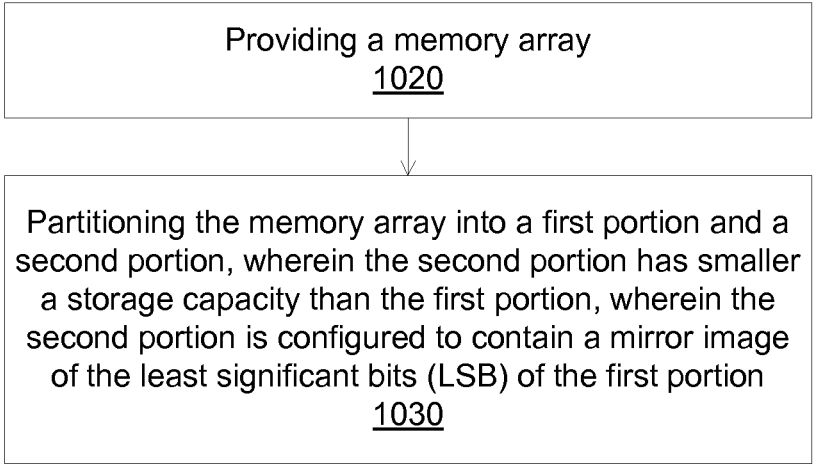
Fig. 10B
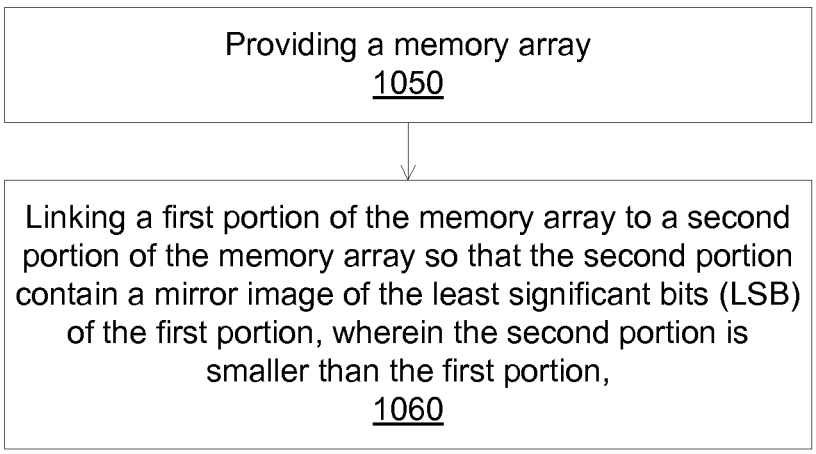
Fig. 10C Storing a mirror image of the least significant bits (LSB) of a main memory array to a redundant memory array
1100

Fig. 11A

Providing a memory array
1120

Storing a mirror image of the least significant bits (LSB) of a portion of the memory array to another portion of the memory array
1130

Fig. 11B

Providing a memory array
1150

Partitioning the memory array into a main memory array and a redundant memory array, wherein the redundant memory array has smaller storage capacity than the main memory array
1160

Storing a mirror image of the least significant bits (LSB) of the main memory array to the redundant memory array
1170

Fig. 11C

Configuring a memory device so that the least significant bits (LSB) of a portion of the memory array is duplicated to another portion of the memory array
1200

Fig. 12A

Providing a memory device, wherein the memory device comprises a memory array and a processor
1220

Loading a program to the processor, wherein the processor is configured to duplicate the least significant bits (LSB) of a first portion of the memory array to a second portion of the memory array
1230

Fig. 12B

Providing a memory device, wherein the memory device comprises a memory array and a processor
1250

Activating a program. wherein the program duplicates the least significant bits (LSB) of a first portion of the memory array to a second portion of the memory array
1260

Fig. 12C

Restoring data to the least significant bits of a first portion of the memory array from a second portion of a memory array
1300

Fig. 13A

Identifying a damage zone of a main memory array
1320

Restoring data from a redundant memory array to the least significant bits (LSB) of the main memory array
1330

Fig. 13B

Powering a memory array, wherein the memory array comprises a main memory array and a redundant memory array, wherein the redundant memory array has smaller storage capacity than the main memory array
1350

Identifying corrupt pages
1360

If there are corrupt pages, restoring data from the redundant memory array to the least significant bits (LSB) of the main memory array
1360

Fig. 13C

SOLVING MLC NAND PAIRED PAGE PROGRAM USING REDUCED SPATIAL REDUNDANCY

BACKGROUND OF THE INVENTION

The present invention relates to systems and methods for managing flash memories and, more particularly, to a method, of managing a multi-level cell flash memory, that is resistant to data corruption when power is interrupted unexpectedly.

Flash memory is an electronic non-volatile storage device that can be electrically erased and reprogrammed. The non-volatile characteristic of the flash memory device can allow the memory device to maintain the stored data even after power to the device is removed. Flash memories can be used in many electronic products such as computers, digital cameras, and mobile phones. Flash memory can be more popular than hard disks, especially for small memory capacity, due to its fast reading access and mechanical shock resistance.

Flash memory was developed from EEPROM (electrically erasable programmable read-only memory), with the internal characteristics of the individual flash memory cells exhibit characteristics similar to logic gates, such as NAND or NOR gates. Although flash memory is technically a type of EEPROM, EEPROM is generally used to refer to memory that can be erasable in bytes, while flash memory, e.g., NAND type flash memory, can be erased and written in blocks and pages, respectively, which are generally much larger than the bytes used in EEPROM erasing operation. Because erase cycles are slow, the large block sizes used in NAND type flash memory erasing can provide a significant speed advantage over EEPROM when writing large amounts of data. In addition, the low cost of flash memory has made flash memory the dominant memory type for large non-volatile, solid state storage.

Flash memory can experience problems due to power interruption while programming the memory cells, especially for multi-level cell (MLC) NAND gate type flash memories. Thus there is a need for a flash management system capable of dealing with power interruptions to MLC NAND flash media.

SUMMARY OF THE EMBODIMENTS

In some embodiments, provided are methods, and systems and programs produced from the methods, to prevent data corruption in a multi-level cell (MLC) flash memory array due to interruption such as power loss. The methods can include using reduced spatial redundancy, e.g., back up, of the stored data, including the non most significant bits, e.g., one or more bits that carry the lower value or weight in binary notation for a numeral. For example, in two-level cells, e.g., two bit cells, the least significant bits are backed up in a redundant memory array.

The reduced spatial redundant memory array can eliminate data disturbance in the least significant page sets due to power interruption while programming the most significant page sets. In addition, the reduced spatial redundant memory array can preserve the overall size of the flash memory devices, since the redundancy does not require doubling the amount of memory spaces.

In some embodiments, the methods can include backing up the non most significant bits of a MLC data storage before performing a programming operation. The data backing can allow data recovering if the programming operation is interrupted.

In some embodiments, provided are data storage systems, e.g., flash memory devices and systems using flash memory devices, that include a reduced spatial redundant data storage medium, together with a data storage medium and a controller for writing data to the data storage medium and the reduced spatial redundant data storage medium. The reduced spatial redundant data storage medium can reduce or eliminate data corruption of the data storage system while not entirely requiring doubling the size of the data storage medium.

In some embodiments, provided is a computer-readable storage medium having computer-readable code embedded in the computer-readable storage medium for storing redundant data of non most significant bits and for recovering the redundant data in cases of data corruption. The computer readable code can be configured to write the non most significant bits of a main data storage medium to a redundant data storage medium, for example, before executing a programming operation for the main data storage medium. The computer readable code can also be configured to check for potential data corruption, for example, due to a power interruption when programming, and to restore data from the redundant data storage medium to the non most significant bits of the main data storage medium. The storing of redundant data can reduce or eliminate the corruption of old data stored in the main data storage medium if writing the new data is interrupted. The redundant storing of non most significant bits can reduce the memory space in the data storage system, since the size of the redundant data storage medium is less than that of the main data storage medium.

BRIEF DESCRIPTION OF THE DRAWINGS

FIGS. 1A-1C illustrate a flash memory structure according to some embodiments.

FIGS. 8A-8B illustrate a two-bit memory device having a reduced spatial redundancy according to some embodiments.

FIGS. 10A-10C illustrate flowcharts for forming a memory array having a redundant memory portion for preventing data corruption according to some embodiments.

FIGS. 11A-11C illustrate other flowcharts for forming a memory array having a redundant memory portion for preventing data corruption according to some embodiments.

FIGS. 12A-12C illustrate other flowcharts for forming a memory array having a redundant memory portion for preventing data corruption according to some embodiments.

FIGS. 13A-13C illustrate flowcharts for preventing data corruption according to some embodiments.

DETAILED DESCRIPTION OF THE EMBODIMENTS

Figure 2:
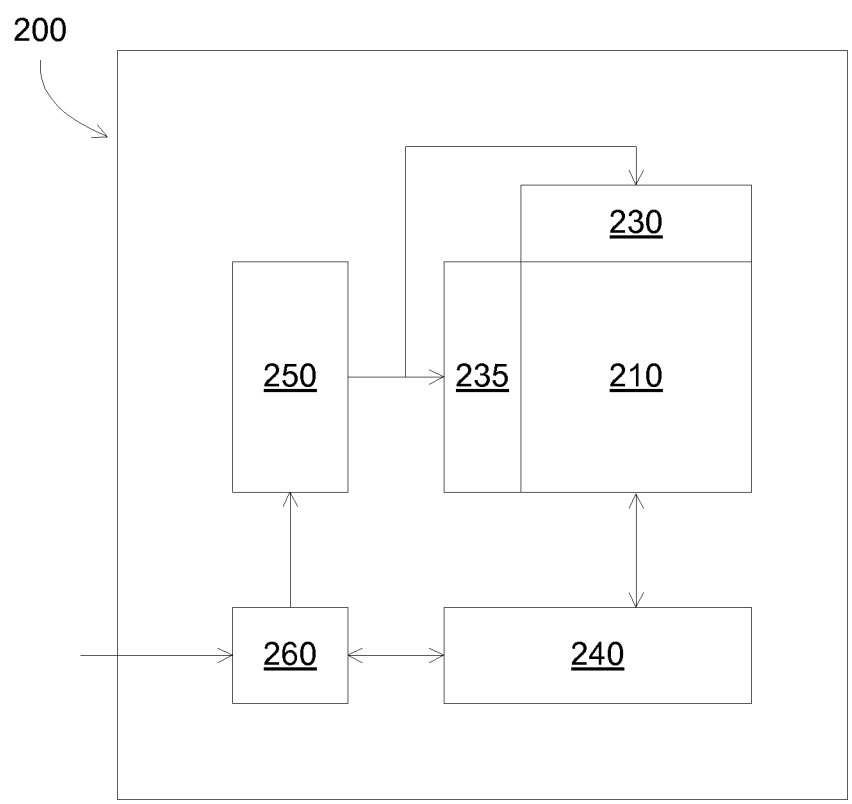
FIG. 2 illustrates a flash memory device according to some embodiments.

In some embodiments, provided are methods to manage a page-based memory so as to prevent the corruption of data with only reduced spatial redundancy. In a multi-level cell (MLC) memory formulated in page-based format, memory values in previously written pages can be corrupted by an interrupted write, e.g., programming, operation. A reduced spatial redundant methodology can be implemented to restore the corrupted data. A portion of the memory data is duplicated, which then can be use to recover the corrupted data. The redundant data portion can include the non most significant bits of the data, e.g., all bits of the data except the most significant bit. For example, in a two bit memory cells, the redundant memory portion includes the least significant bits. In a three bit memory cells, the redundant memory portion includes the least significant bits and the middle bits. The reduced spatial redundant methodology does not require a full mirror image of the data, but can offer full protection against data corruption due to interrupted programming operation.

The reduced spatial redundant methodology can provide an improved flash management system, which is capable of dealing with power interruptions for a broad class of flash devices, including MLC NAND flash media.

In some embodiments, provided is a method and system for managing a page-mode flash memory device, such as a MLC NAND flash device, that can preserve data integrity of the memory device after an interrupted programming operation. The method can include mirror imaging the non most significant bits of the memory values, which can be used to recover the memory data after the interruption. The method can include checking and recovering data after an initial powering of the memory device. Such flash memory devices can be installed in a variety of electronic devices, such as a personal or laptop computer.

While this invention will be described in the context of a flash memory, those skilled in the art will understand that its teachings are also applicable to data storage devices with the same write, read, and unit erase characteristics as flash memories.

FIGS. 1A-1C illustrate a flash memory structure according to some embodiments. In FIG. 1A, a physical memory cell 100 includes a source 120, and a drain 130 fabricated on a substrate. A control gate 110, and a floating gate 115 are electrically isolated from the substrate by an insulating layer. Memory cell 100 is basically a transistor, e.g., control gate 110 separating source region 120 and drain region 130, with the addition of a floating gate 115. The floating gate 115 can be electrically charged or discharged only through a capacitor network of source 120, drain 130, channel in the substrate between the source and drain regions, control gate 110, and surrounding insulating layers. Charges present on the floating gate 115 can be due to the inherent energy barrier height of the substrate-insulating layer, e.g., Si—SiO$_2$, leading to the nonvolatile nature of the memory cell. The trapped charges on the floating gate 115 can be used to store data.

FIG. 1B shows a circuit symbol 101 for a memory cell 100. The symbol 101 for flash memory 100 includes source, drain, control gate connections, together with an isolated floating gate region. FIG. 1C shows a NAND flash memory device 150 including multiple memory cells 100 arranged in a matrix form. The memory device 150 include bit lines 170 and word lines 160. The bit lines 170 extend parallel to each other in a column direction. The word lines 160 extend parallel to each other in a row direction perpendicular to the column direction. Select transistors 190 at upper and lower bit lines can be included in memory device 150, for selecting the memory columns.

Each bit line 170 can include a column of memory cells 100, gated by select transistors 190. The memory cells 100 can be floating gate transistors as shown in FIG. 1A, coupled to each other in series from source to drain. The control gates in the same row can be coupled to a same word line 160. Each of the memory cells 100 can store a charge, with the amount of stored charge represent a state of the memory cell 100. For example, the amounts of charge stored in the memory cells 100 can be detected by sensing the threshold voltages or currents flowing through the source and drain regions of the memory cells 100.

FIG. 2 illustrates a flash memory device according to some embodiments. A flash memory device 200 can include a memory array 210 addressed by a row decoder 235 and a column decoder 230. Controller and address logic 250 and data register 240 can be used to read and program the memory array, for example, after selecting the rows and columns of the memory array 210. I/O module 260 can be used to interface with external components, such as a processor. Other components can be included for the operation of the memory device, such as sense amplifiers.

In some embodiments, the memory array 210 can include a regular section and a repair section. During the fabrication of the memory device, some memory cells in the regular section can be damaged or not met the required specification. The memory cells in the repair section can be used to replace the defective cells, for example, by re-routing the addresses or by an error correction software.

Controller and address logic 250 can include command circuitry to control the basic operations of the memory device, for example, including a state machine to control specific operations performed on the memory array and cells. The command circuitry can control read, write, erase and other memory operations. The state machine or the command circuitry can direct operations of an address counter, which is configured to increment an address of the memory array 210. The row and column decoders can be coupled to the state machine and the address counter.

Memory array 210 can be accessed by a row decoder 235, which activates a row of memory cells by selecting the word line coupled to the gates of the memory cells. The rows (commonly referred to as pages) of the memory device can be programmed by applying a programming voltage to the control gates of the selected memory cells and then coupling the channels of the memory cells to either a program or inhibit voltage. A programming voltage can program the memory cells to logical "0" by the injection of charge to the floating gate of the memory cells. An inhibit voltage can leave the memory cells unprogrammed and stayed in its original state, for example, leaving the memory cells erased and set at logical "1".

Figure 3:
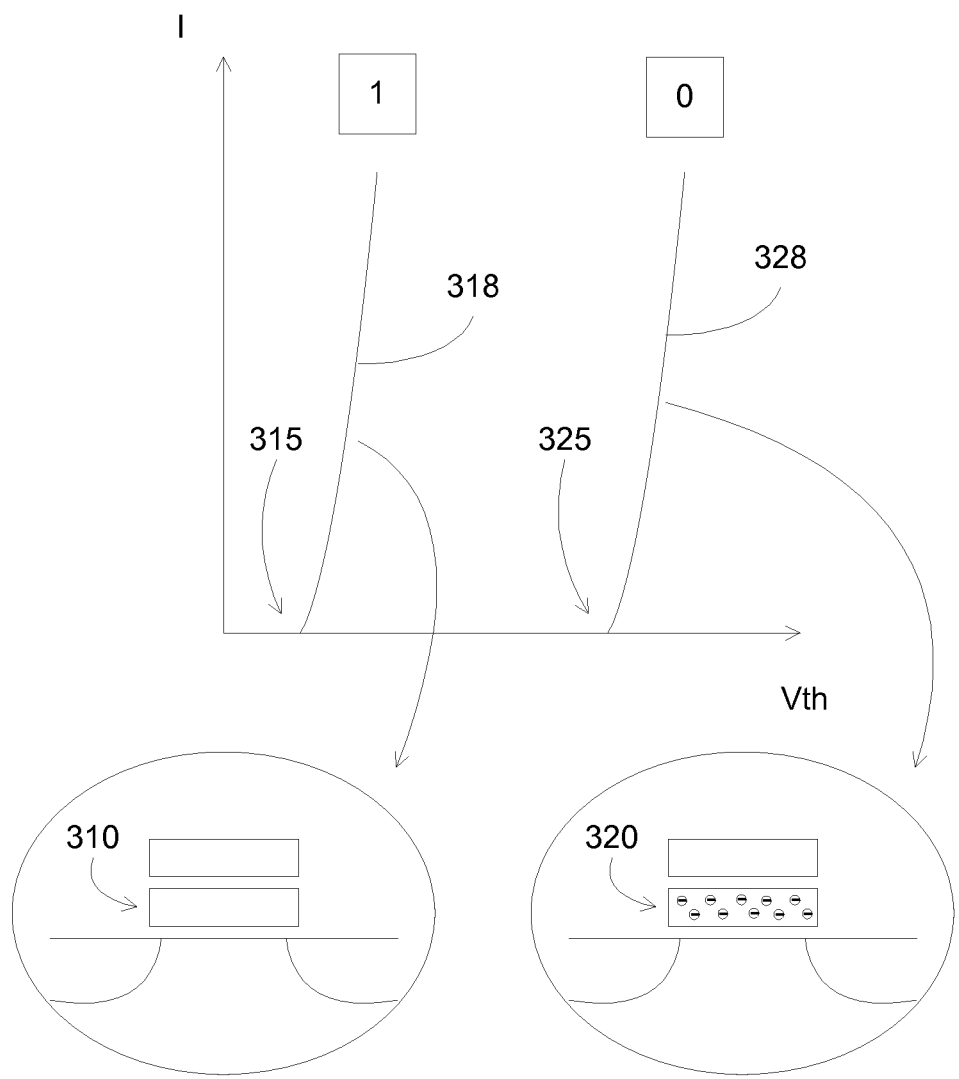
FIG. 3 illustrates an operation of a flash memory cell according to some embodiments.

FIG. 3 illustrates an operation of a flash memory cell according to some embodiments. A memory cell 310 can have a floating gate not having any charges, resulting in an IV response curve 318. The IV response curve 318 can have a low threshold voltage value 315, e.g., a low voltage before the current can pass between the source and drain of the memory cell. This state can be characterized as state "1" of the memory cell. A memory cell 320 can have a floating gate having negative charges, resulting in an IV response curve 328. The IV response curve 328 can have a high threshold voltage value 325, e.g., a high voltage (e.g., higher than the threshold voltage 315 of memory cell 310 representing state "1") before the current can pass between the source and drain of the memory cell. This state can be characterized as state "0" of the memory cell.

Programming a flash memory cell can include adding charge (e.g., electrons) to the floating gate of the memory cell. For example, a high drain to source bias voltage can be applied, along with an application of a high voltage to the control gate. The gate voltage inverts the channel between the source and drain, and the drain to source bus accelerates electrons towards the drain in the channel. Some electrons will travel across the insulating layer to reach the floating gate. These electrons become trapped in the floating gate to change the threshold voltage of the memory cells.

Reading a flash memory cell can include applying a control gate voltage and monitoring the drain current. Low currents indicate a high threshold voltage, and high currents indicate a low threshold voltage. A sense amplifier can compare the drain current with that of a reference cell to determine the state of the memory cells.

Erasing a flash memory cell can include applying a positive voltage to the source, and a negative or a ground voltage to the control gate. The drain is allowed to float. Under these conditions, a high electric field is present between the floating gate and the source, allowing the trapped electrons in the floating gate to tunnel through the insulating layer to the source. Erasing flash memory is typically performed by applying electrical voltages to many cells at once so that many cells are erased simultaneously.

Figure 4:
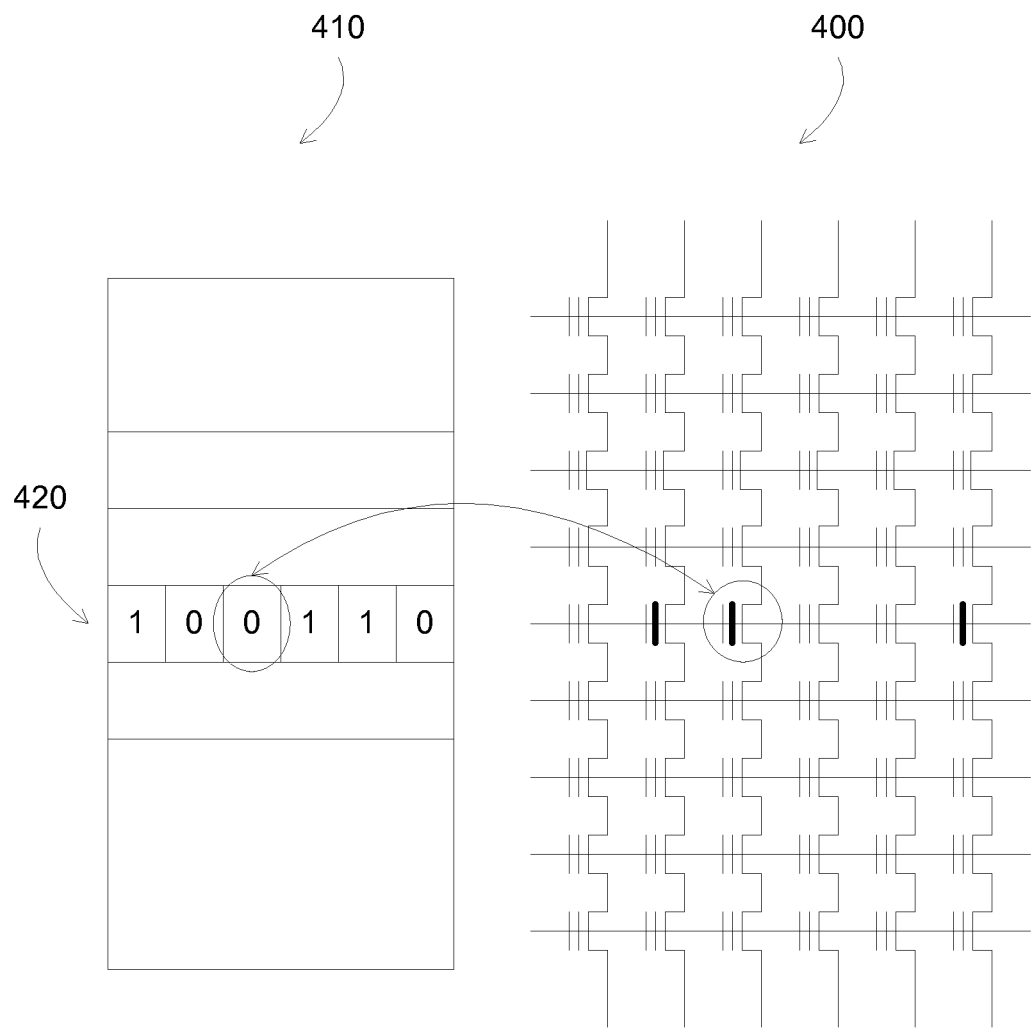
FIG. 4 illustrates a page representation of a memory array according to some embodiments.

FIG. 4 illustrates a page representation of a memory array according to some embodiments. Memory array 400 can be organized into blocks 410 and pages 420. A block 410 can represent a memory array 400, while a page 420 can represent a row of the memory array. Each bit in a page 420 corresponds to a physical memory cell of the memory array. In general, NAND flash media typically are written in page units 420, each of which can be 256 or 512 bytes. NAND flash media typically are erased in block units 410, each of which typically includes between 16 and 64 pages.

The page-mode memory can provide significant advantages for successful data storage and retrieval. For example, page-mode memory has only a fixed overhead for writing a page or any part of a page. Page-mode memory can be configured to include several spare bytes in each page.

Since the flash memory is a non volatile memory, the data should be retained under all circumstances. A major risk to the stored data integrity is a power interruption, especially when the memory device is under an operation. Such a power failure can cause the operation to have erratic or unpredictable results.

For example, if a power failure occurs while memory device is in the middle of writing a page of data or in the middle of erasing a block, the contents of the interrupted page or block can be unpredictable after memory device has been powered up again. Some of the affected bits can reach the assigned states. Some may not yet at target values. And some may be in intermediate states which can produce different results in different read operations.

The data corruption due to power interruption can be addressed by realizing that the data corruption tends to be localized to the page or block that are being modified when the power failure occurs. A flash management system can include a data correction operation by assuming the validity of all other pages and concentrate on the last page written. For example, a pointer can be used to indicate the page to be written or the block to be erased.

Recently, the assumption about the localization of data correction does not hold for other classes of flash memory devices, such as multi level cell (MLC) NAND flash memory. In MLC flash memory, each cell stores more than one bit of data.

Figure 5:
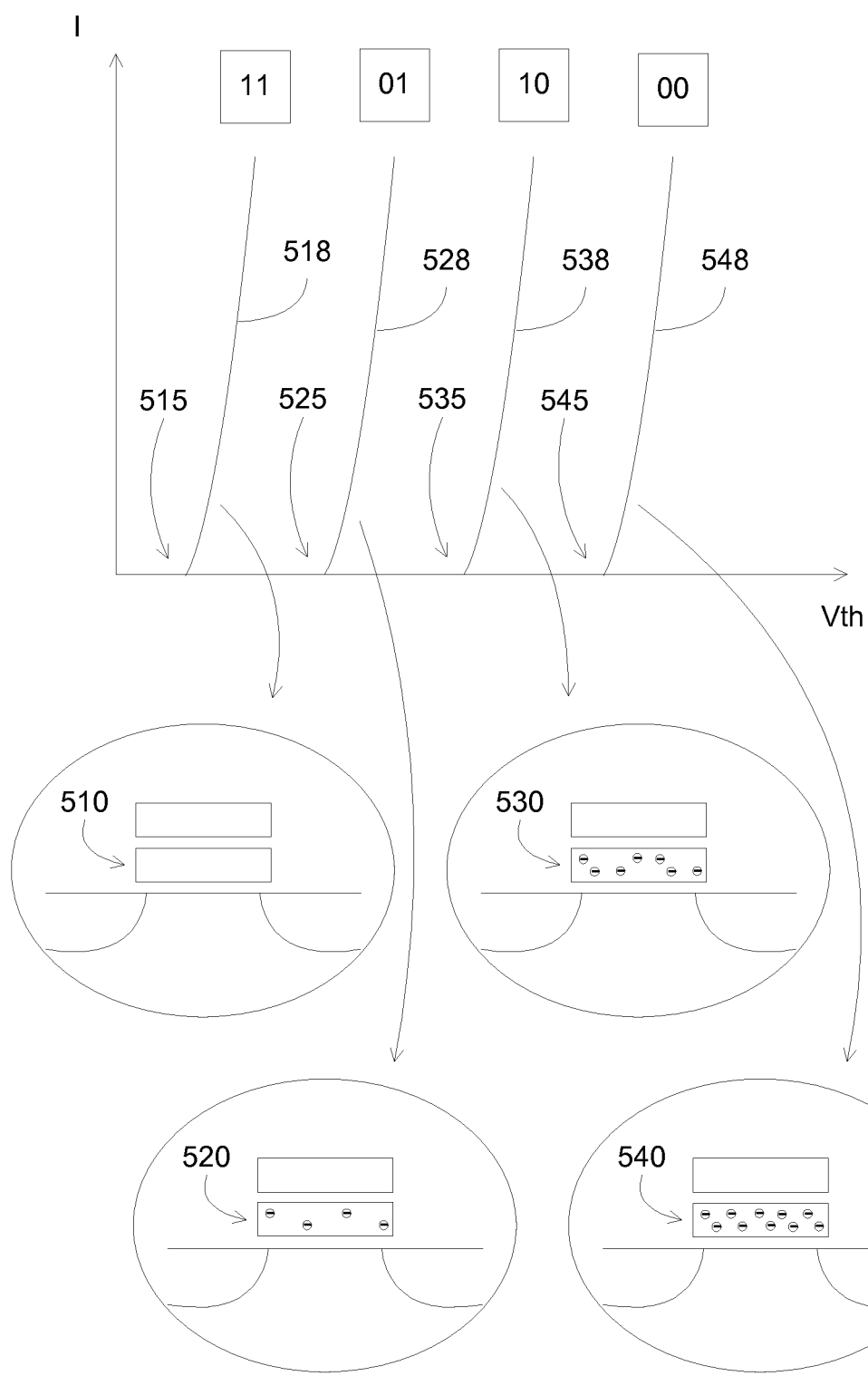
FIG. 5 illustrates an operation of a MLC flash memory cell according to some embodiments.

FIG. 5 illustrates an operation of a MLC flash memory cell according to some embodiments. A memory cell 510 can have a floating gate not having any charges, resulting in an IV response curve 518. The IV response curve 518 can have a low threshold voltage value 515, e.g., a low voltage before the current can pass between the source and drain of the memory cell. This state can be characterized as state "11" of the memory cell. A memory cell 520 can have a floating gate having some negative charges, resulting in an IV response curve 528. The IV response curve 528 can have a high threshold voltage value 525, e.g., a higher voltage than the threshold voltage 515 of memory cell 510 representing state "11" before the current can pass between the source and drain of the memory cell. This state can be characterized as state "01" of the memory cell. A memory cell 530 can have a floating gate having some more negative charges, resulting in an IV response curve 538. The IV response curve 538 can have a higher threshold voltage value 535, e.g., a higher voltage than the threshold voltage 525 of memory cell 520 representing state "01" before the current can pass between the source and drain of the memory cell. This state can be characterized as state "10" of the memory cell. A memory cell 540 can have a floating gate having most negative charges, resulting in an IV response curve 548. The IV response curve 548 can have a higher threshold voltage value 545, e.g., a higher voltage than the threshold voltage 535 of memory cell 530 representing state "01" before the current can pass between the source and drain of the memory cell. This state can be characterized as state "00" of the memory cell.

There are four different levels of negative charges on the floating gate of the memory cell, e.g., cell 510 having the least amount of negative charges, cell 520 having more negative charges, cell 530 having even higher amount of negative charges, and cell 540 having the most amount of negative charges. These four levels of charges represent four different states, e.g., 11, 10, 01, and 00, or a two bit memory cell. The states representative of the charge and threshold levels are merely illustrative, with other possible mapping of states to the charge and threshold levels. For example, the four states of the two bit memory cell can be 11, 01, 10, and 00, corresponded to the lowest to the highest amount of charges and threshold levels.

The flash memory cell can have other numbers of bits, such as three bits, representing 8 states, or four bits, representing 16 states. The multi-level-cell process of storing data of two or more bits in one cell can be used to reduce bit costs and chip size. A disadvantage of multi-level cell is the potential interferences between adjacent cells, together with high read and program noise, which can result in the spreading of a threshold voltage distribution of memory cells, leading to memory data corruption.

The MLC flash memory can also be structured in page mode with lower bits programmed separately from higher bits. For example, the lower bits of the memory cells can be used in different times than the higher bits.

Figure 6A:
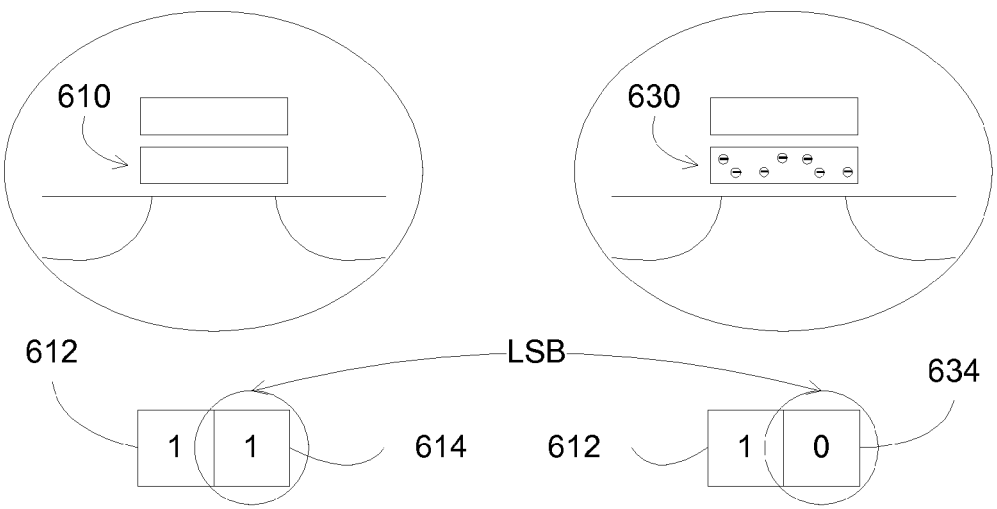
FIGS. 6A-6C illustrate a programming sequence of a MLC memory cell according to some embodiments.
Figure 6B:
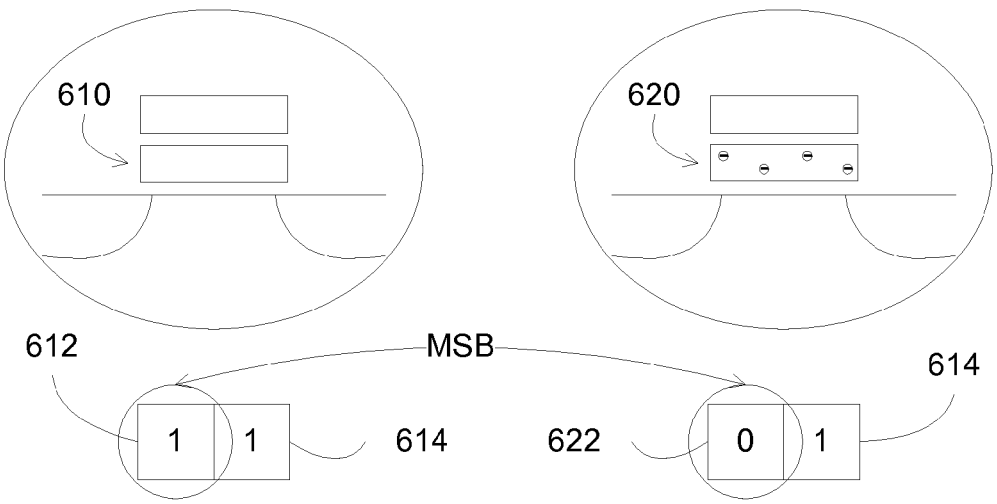
Figure 6C:
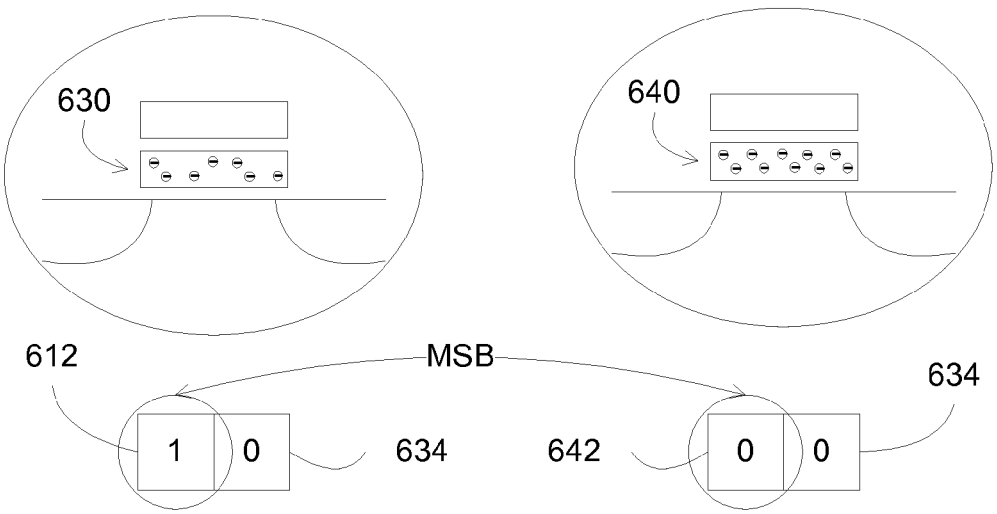

FIGS. 6A-6C illustrate a programming sequence of a MLC memory cell according to some embodiments. In FIG. 6A, the lower bit of a memory cell, e.g., the least significant bit of the two bit memory cell, is configured between state 1 and state 0. Memory cell 610 can have zero charges in its floating gate, for example, after an erasure operation, representing state 11, e.g., having most significant bit (MSB) 612 to be 1, and least significant bit (LSB) 614 to be 1. A moderate amount of charges can be transferred to the floating gate, resulting in memory cell 630 having state 10. The LSB value is programmed from state 1 (element 614) to state 0 (element 634), while the MSB value is unchanged, e.g., remaining at state 1 (element 612).

In FIGS. 6B and 6C, the higher bit of a memory cell, e.g., the most significant bit of the two bit memory cell, is configured between state 1 and state 0. FIG. 6B shows a program operation when the least significant bit is 1 and FIG. 6C shows a program operation when the least significant bit is 0.

In FIG. 6B, memory cell 610 can represent state 11, e.g., having most significant bit (MSB) 612 to be 1, and least significant bit (LSB) 614 to be 1. A small amount of charges can be transferred to the floating gate, resulting in memory cell 620 having state 01. The MSB value is programmed from state 1 (element 612) to state 0 (element 622), while the LSB value is unchanged, e.g., remaining at state 1 (element 614).

In FIG. 6C, memory cell 630 can represent state 10, e.g., having most significant bit (MSB) 612 to be 1, and least significant bit (LSB) 634 to be 0. A small amount of charges can be transferred to the floating gate, adding to the existing moderate amount of charges in the floating gate, resulting in memory cell 640 having state 00. The MSB value is programmed from state 1 (element 612) to state 0 (element 642), while the LSB value is unchanged, e.g., remaining at state 0 (element 634). Other programming schemes can also be used, such as a small amount of charges for LSB programming, and a moderate amount of charges for MSB programming.

Figure 7:
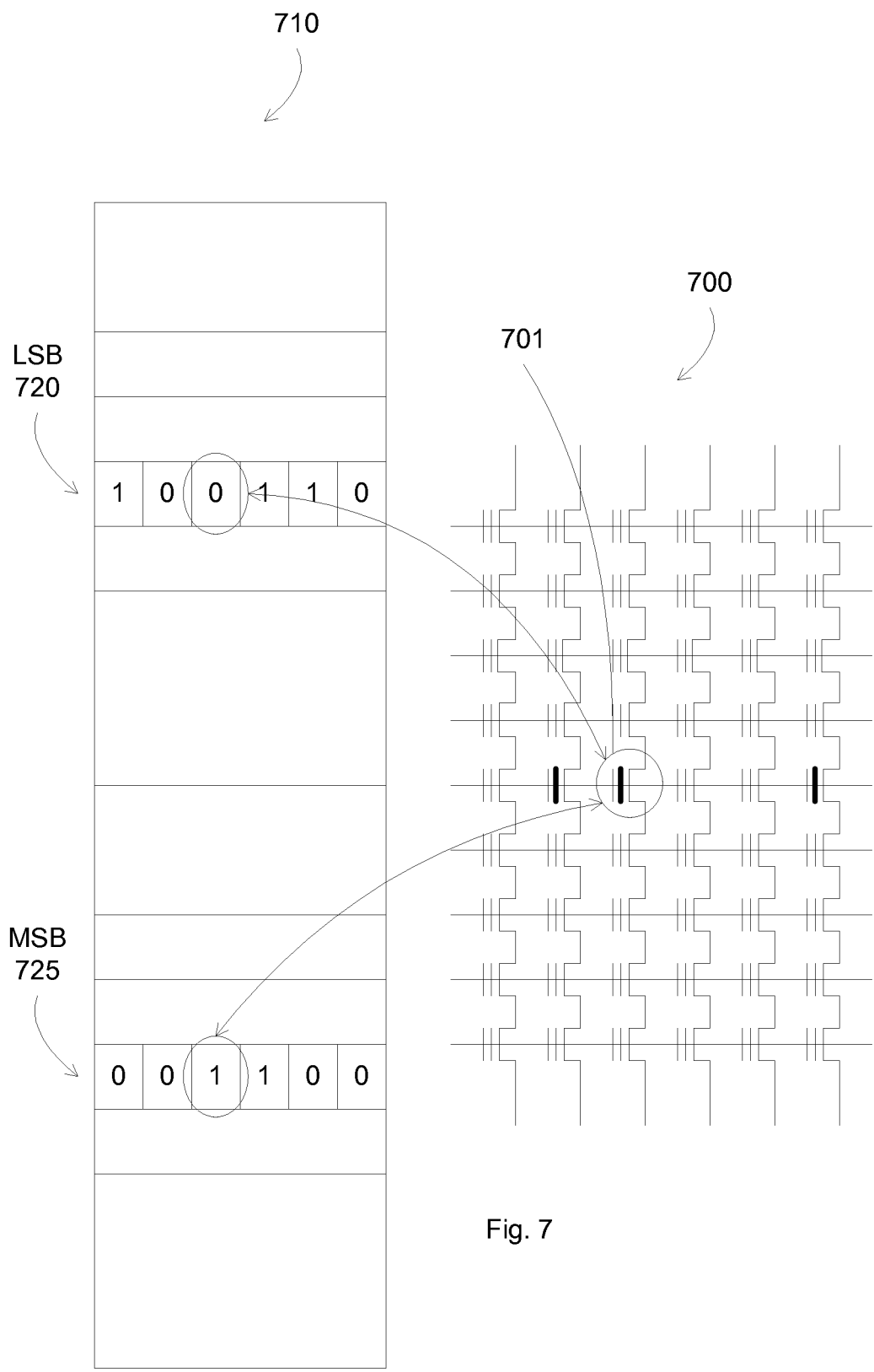
FIG. 7 illustrates a page mode representation of a two bit memory array according to some embodiments.

FIG. 7 illustrates a page mode representation of a two bit memory array according to some embodiments. The memory array only shows a schematic of the flash memory cells, omitting other elements such as row and column decoder, sense amplifier, controller and address logic.

Similar to the memory cells of single level cell (SLC) memory, the memory cells are arranged in an array of rows and columns. The cells in each row are coupled to a word line through the control gate. The cells in each column are serially connected, e.g., drain region of a cell is shared or connected to source region of an adjacent cell, and then connected a bit line (not shown). The word lines and bit lines can be used for erase, read and write operations.

The memory array 700 can be mapped to a page-mode memory block 710. The size of a page can be determined by the number of cell columns in the memory array. The number of pages 720, 725 in each memory block is twice the number of cell rows for two-bit memory cell array. In a page mode memory mapping, two different pages share a same memory cell rows. Least significant bit (LSB) pages 720 are configured to stored the values of the LSB of the memory cells. Most significant bit (MSB) pages are configured to stored the values of the MSB of the memory cells. For example, memory cell 701 can be programmed to store a LSB 0 in LSB page 720. At a later time, and perhaps to a different file, memory cell 701 can be programmed to stored a MSB 1 in MSB page 725.

In some embodiments, provided are methods for preventing data corruption in MLC memory, for example, due to power interruption. The methods include providing a reduce spatial redundancy for the MLC memory, such as storing mirror images of the lower bits of the memory values. The lower bit redundancy can prevent data corruption of lower bits, e.g., bits stored in LSB pages, for example, by having the ability to restore the data from the redundant storage when the main storage is corrupted. The lower bit redundancy can save memory space, by providing mirror images for only the lower bits, e.g., all bits except the most significant bits.

The lower bit redundancy methodology can address the non-localization of data corruption in a MLC memory array. Further, the lower bit redundancy methodology can be used with any flash management system, since any extend of data corruption can be recovered through the redundant storage.

In some embodiments, the lower bit redundancy methodology can provide significant advantages over software recovery methods, since software recovering methods tend to require the knowledge of the extend of data corruption. For example, software recovering methods can require knowing the risk zone, e.g., the memory area that can be affected by the interrupted programming or erasing operation, can be determined accurately, the data in these risk zones can be saved for data recovery by a software algorithm.

In contrast, the lower bit redundancy methodology does not require knowing how far the data corruption can be. Since all lower bit data are automatically imaged, recovering can be performed for any potential corruption of data. For example, the lower bit redundancy methodology can be used in flash memory devices where there are no boundaries for the propagation of risk. The complex risk zone structures may be created due to the implementation of techniques for reducing or eliminating interference between adjacent word-lines of its array of flash cells that can affect the writing order of the pages.

Figure 8B:
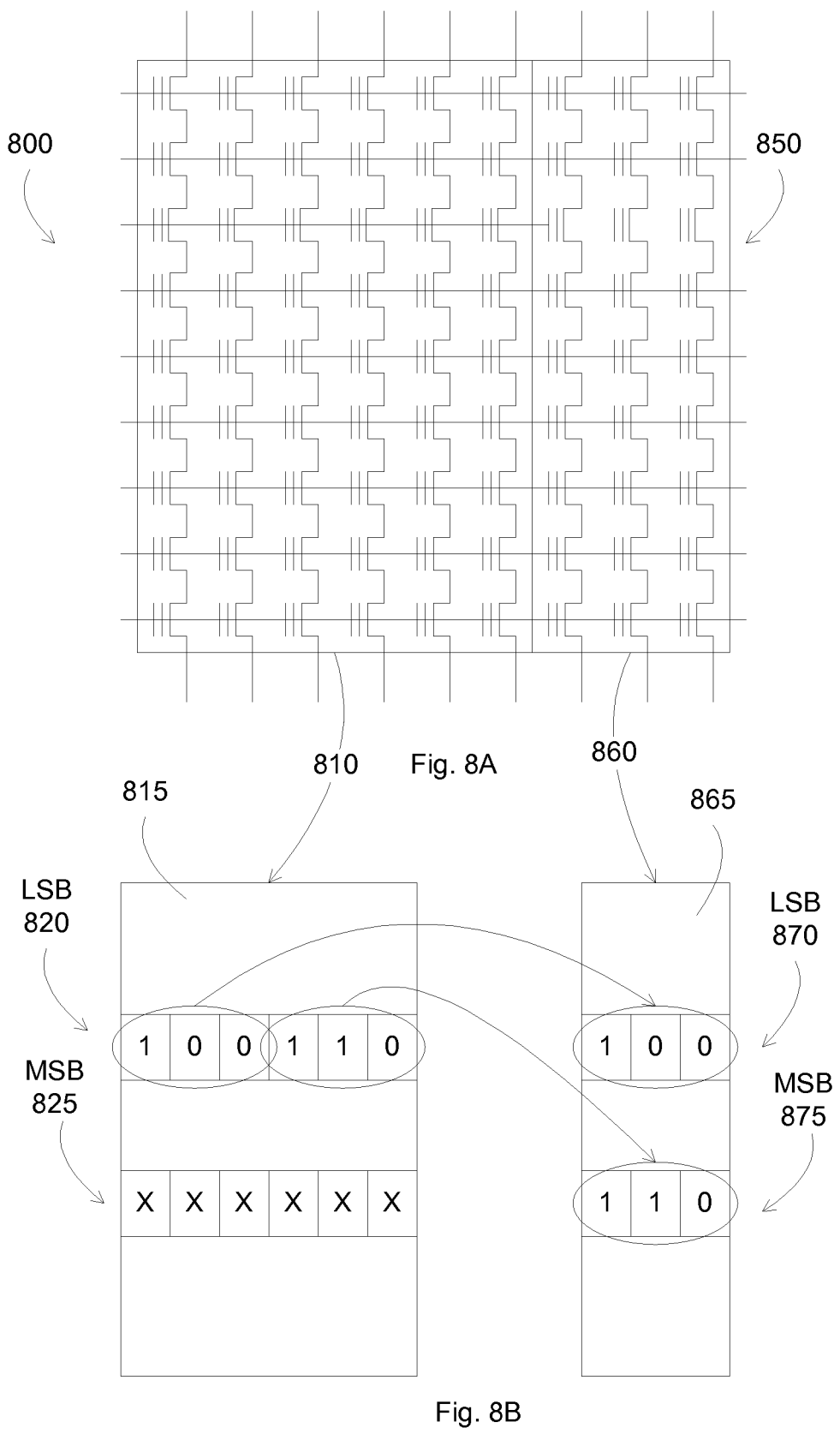

FIGS. 8A-8B illustrate a two-bit memory device having a reduced spatial redundancy according to some embodiments. In FIG. 8A, a memory array can be partitioned into a main memory array 800 and a redundant memory array 850. The redundant memory array 850 can have a smaller capacity, e.g., smaller size, than the main memory array 800. The redundant memory array 850 can be configured to store a mirror image of the lower bits of the main memory array 800. For example, in two-bit memory devices, the redundant memory array 850 is configured to store the least significant bits of the data stored in the main memory array 800.

FIG. 8B shows a page mode mapping of the memory array. The main memory array 800 can be mapped to a block 810, which includes LSB pages 820 and MSB pages 825. The LSB pages 820 are mapped to the lower bit, e.g., the least significant bit of the two-bit memory cells in the main memory array 800. The MSB pages 825 are mapped to the higher bit, e.g., the most significant bit of the two-bit memory cells in the main memory array 800.

The redundant memory array 850 can be mapped to a block 860, which includes LSB pages 870 and MSB pages 875. The LSB pages 870 are mapped to the lower bit, e.g., the least significant bit of the two-bit memory cells in the redundant memory array 850. The MSB pages 875 are mapped to the higher bit, e.g., the most significant bit of the two-bit memory cells in the redundant memory array 850. In addition, the redundant memory array 850 is configured to store a mirror image of the lower bits of the main memory array 800. For example, the LSB pages 870 can be configured to store a copy of the first half of the LSB pages 820 of the main memory array 800. The MSB pages 875 can be configured to store a copy of the second half of the LSB pages 820 of the main memory array 800. Other configurations of redundant memory array can be used, for example, the first half of the LSB pages 820 can be stored in the MSB pages 875, and the second half of the LSB pages 820 can be stored in the LSB pages 870.

In some embodiments, the redundant images can be performed by a hardware, e.g., a circuit to allow copying the lower bits of the main memory array to the data of the redundant memory array. In some embodiments, the redundant images can be performed by software, e.g., a program such as a firmware, executed by a processor or a controller to copy the lower bits of the main memory array to the data of the redundant memory array. The copying process can be performed before a writing or erasing operation, which can allow the data recovery in the main memory array if the data become corrupted, e.g., due to power interruption.

In some embodiments, the data recovery can be conditionally performed after a power up of the memory device. For example, a flag can be set to indicate an interrupted operation, and upon re-powering, the device controller can check the flag condition and execute the data recovery.

Other configurations can be used, such as additional spare memory array for correcting fabrication defects in the main memory array, or different sizes for the redundant memory array to accommodate multiple bit memory cells, such as redundant memory array having two thirds the size of the main memory array to store two lower bits of three-bit memory cells in the main memory array, or redundant memory array having one third the size of the main memory array to store one lower bit (e.g., the LSB) of three-bit memory cells in the main memory array.

Further, additional components can be included, such as circuits or software to copy data from the main memory array to the redundant memory array, and/or circuits or software to restore data from the redundant memory array to the main memory array.

In some embodiments, the memory array, including a main memory array and a redundant memory array for imaging lower bits of the memory cells in the main memory array, can be used in a data storage device, such as a solid state drive (SSD) or a flash drive. The memory array can include multiple multi-level cells, which map to one or more blocks, with each block including multiple pages. Each bit of the multi-level cells can be represented by separate pages, such as LSB pages for mapping from the LSB of the multi-level cells, MSB pages for mapping from the MSB of the multi-level cells, and/or middle pages for mapping from the middle bits. The data storage device can include a controller to manage the memory array, such as copy data to the redundant memory array or restore data to the main memory array. The management of the memory data can be configured to prevent corruption of old data previously stored in lower bit pages, for example, due to an interruption of a writing operation to other pages, such as a MSB page of the memory array.

Figure 9A:
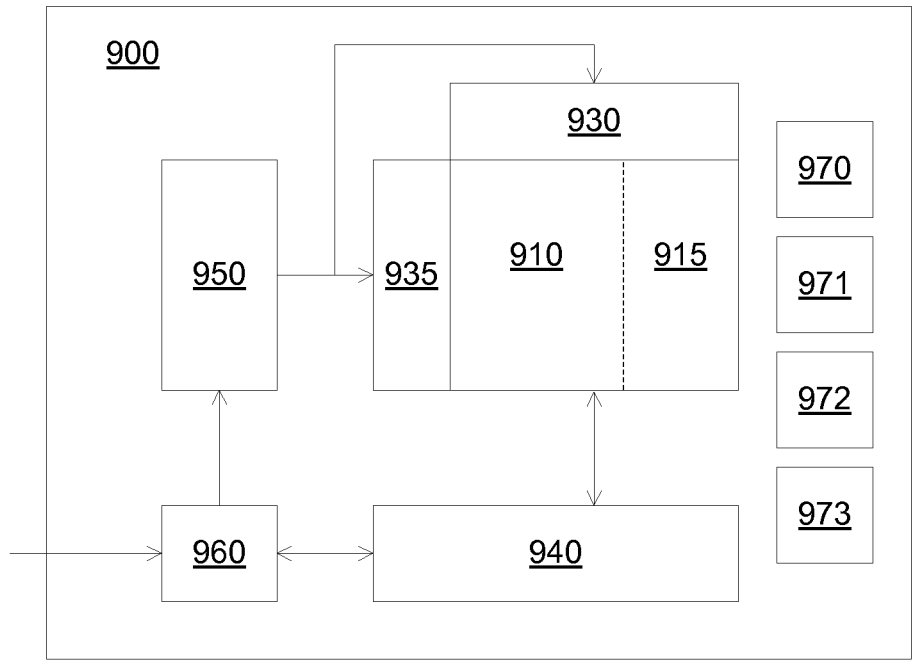
FIGS. 9A-9B illustrate data storage systems incorporating a redundant memory array according to some embodiments.
Figure 9B:
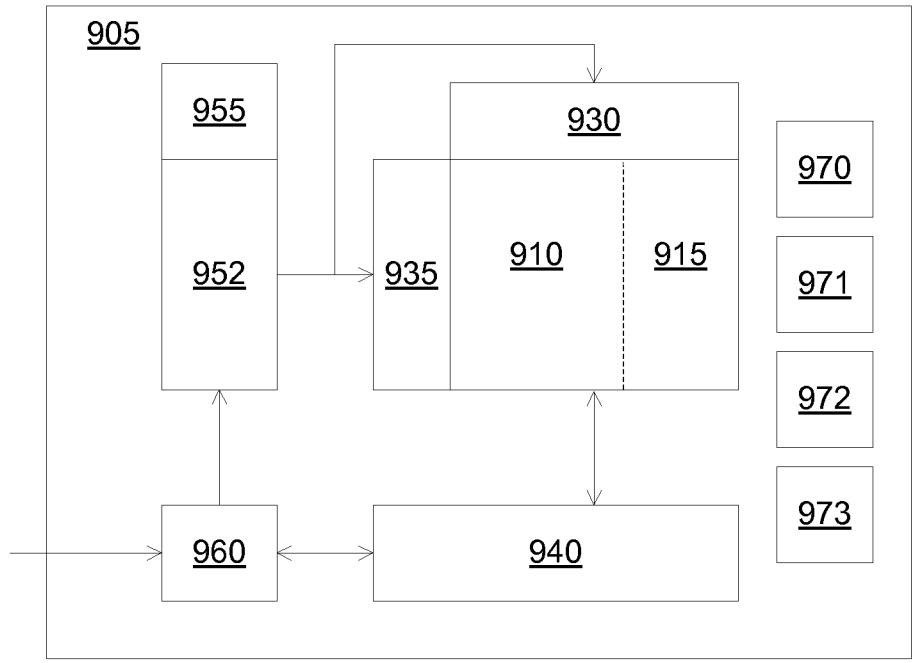

FIGS. 9A-9B illustrate data storage systems incorporating a redundant memory array according to some embodiments. The data storage system can include a memory array and a controller, which can be operationally associated together within a common housing, or in separate devices. For example, the memory array can be mounted on a host device, with the controller the central processing unit of the host device.

A data storage device 900 can include a memory array 910/915 addressed by a row decoder 935 and a column decoder 930. Controller and address logic 950 and data register 940 can be used to read and program the memory array. I/O module 960 can be used to interface with external components, such as a processor. Other components can be included for the operation of the memory device, such as sense amplifiers.

In some embodiments, the memory array 910/915 can include a main memory array 910 and a redundant memory array 915. The separation of the memory array into main and redundant arrays can be arbitrary, such as certain memory cells can be configured as redundant memory cells, or separate section of the memory array can be configured as a redundant memory array. The size of the redundant memory array 915 is smaller than that of the main memory array, since the redundant memory array is configured to duplicate only the lower bits of the memory cells in the main memory array, e.g., without storing at least the most significant bits.

The separation can be performed by software, e.g., the separation of main and redundant memory arrays can be accomplished by a look up table identifying individual memory cells (FIG. 9A). A memory data management system can be loaded to controller 950, which can configure the memory array 910/915 as a main memory and a redundant memory. For example, a memory data management system executed by the controller 950 can include operations to duplicate the lower bits of the main memory array to the redundant memory array. The memory data management system can include provisions and/or conditions for automatically perform the redundancy operation, such as before a write operation, or before an operation of writing to MSB pages. Other conditions for redundancy operation can be included for saving the lower bit values, such as before an erasing operation or a write to lower bits.

The data management system can also include provisions and/or conditions for restoring the data in the redundant memory array to the main memory array. For example, during an integrity checking of the data storage system, data from the redundant memory can be restored to the main memory array if abnormal conditions are detected. Further, during a power up, data from the redundant memory can be copied to the lower bits of the memory cells of the main memory, preventing any potential data corruption. For example, after the data stored in the memory are checked and determined to be corrupted, these data can be replaced with data from the redundant memory. The data checking can be performed by using an error detection code.

Further, the data management system can include provisions to detect power interruption, such as during a write operation. For example, a flag can be set before performing a write operation, and then reset after the write operation is completed. If the flag is detected as not being reset during a power up, the flag condition can signal a power interruption, and data recovery, e.g., restoring the data from the redundant memory to the lower bits of the memory cells of the main memory, can be performed.

The separation can be performed by hardware, e.g., physically separated main and redundant memory arrays (FIG. 9B). For example, a circuit 955 can be included to manage the transfer of data between the main memory array and the redundant memory array. Circuit 955 can coupled to addresses of the redundant memory array, e.g., LSB pages and MSB pages, to the addresses of the lower bits of the memory cells in the main memory array, e.g., LSB pages. Commands from the controller 952 can be issue to perform the data duplication or data restoration.

In addition, the memory array can include a repair or spare section for replacing the defective memory cells. In some embodiments, all or a portion of the repair or spare memory section can be used as the redundant memory. In some embodiments, the repair or spare memory section can be first used to repair defected cells, and the remaining memory portion can be used as redundant memory array. All lower bits of the memory cells in the main memory array can be duplicated to the redundant memory array. Alternatively, selective lower bits of the memory cells in the main memory array can be duplicated to the redundant memory array. The size and selection of the selective lower bits can be chosen to suit the size of the redundant memory array, e.g., the remaining memory portion of the repair or spare memory section after being used for repairing defected cells. The configuration of the remaining repair or spare memory section can improve the utilization of the repair or spare memory section, allowing a complete usage of the repair or spare memory section.

In some embodiments, provided is a NAND management firmware, or a flash data management system, in a solid state drive (SSD) utilizing multi-level cell (MLC) memory array. The management firmware can address the paired page program of the MLC memory, which is caused by the fact that more than 1 bit of data (2 or more bits) are staged in a single NAND cell. For example, the programming of a second page set, e.g., the MSB page containing the most significant bits, can cause a disturbance in a first page set, e.g., the LSB page containing the least significant bits, due to interruptions such as power lost.

In some embodiments, a reduced spatial redundancy, e.g., back up, can be used for recovering the corruption of data with only a small redundant memory storage, e.g., smaller than the to-be-mirrored memory array. The reduced spatial redundancy can effectively address the potential data corruption of paired page memory configuration without requiring mirrored redundancy or capacitors, which essentially requires double the amount of space.

In some embodiments, within a particular NAND block in a MLC NAND device, the pages are divided into multiple page sections, such as upper/first/MSB and lower/second/LSB pages, in which one bit (out of 2 bits for two-bit memory cells) of an array of NAND cells is used to represent the upper/first/MSB pages and the other bit is used to represent the lower/second/LSB pages. In typical page programming operations, LSB pages are programmed first, followed by the corresponding MSB pages. A corruption can occur in the LSB pages when an interruption, such as a power lost, occurs during the process of programming the corresponding MSB page.

In some embodiments, a firmware can include an internal mapping management such that redundancy is used to mirror only the lower bit pages. No redundancy is performed for the MSB pages. For two-bit memory cells, this can result in using only 25% of the space required instead of 50% of the space. In some embodiments, the redundancy can be placed in a different block and can be placed in either lower or upper pages section, as long as the mapping does not allow further modification to the block that may result in corruption. For example, programming to the two blocks containing lower pages mirror should not be allowed to occur at the same time.

In some embodiments, the lower bits of data in a flash memory can be protected by the redundant memory. The higher bits, e.g., the MSB of the data, can be protected by a localization protection scheme. For example, in the case of an interrupted write operation, the flash management system can assume the validity of other pages and concentrate on the last few pages written. A validity flag can be used to signal to the controller about the completion of a writing or erasing operation. For example, a pointer pointed to the page to be written or to the block to be erased, can be stored in a predetermined location before the operation. When the flash device powers up, the controller can look up this pointer to identify the page or block that was the last one targeted. Data in the last few pages or blocks can be assumed to be corrupted, and can be re-written. Alternatively, data can be limited to certain locations during a write operation, e.g., only to a subset of pages. If power is interrupted, these locations can be considered as potential corrupt, and the controller can avoid using data in these locations upon powering up.

Corruptions may be detected upon a power up and corrected using the mirror of the data from the redundancy. An alternative to checking during power up is checking during operation. For example, upon request of a read to a corrupted data the system could use error detection to determine data corruption, remap to the redundant data and return the correct data. During data collection, garbage collection or other data movement operations, the firmware can exercise the same method to ensure data is correctable upon corruptions.

In some embodiments, the data storage device can include a flash-based storage device, which can be used by a host device for storing data in one or more NAND flash media. The operation of the data storage device can be controlled by a microprocessor-based controller, together with optional RAM and auxiliary non-volatile memory. The storage device and the host system can communicate via a common communication port in the storage device.

The flash-based storage device can emulate a block memory device, using a firmware, e.g., an operating program, stored in auxiliary non-volatile memory. The firmware can also include a data management process of copying lower bits of data in multi level cells to a redundant memory array, and of copying data from the redundant memory array back to the lower bits of data. The firmware can be stored as part of the operating system and executed by controller, includes code for implementing the flash management methods to prevent data corruption in MLC memory of the NAND flash media.

In some embodiments, the firmware can allow writing to the flash memory without any risk of data corruption. The lower bits can be protected by the redundant memory, and/or the higher bits can be protected by a localization protection scheme. Thus the firmware can provide full protection against data corruption due to power loss.

In some embodiments, the redundant memory array can be configured as MLC cells, e.g., having LSB pages and MSB pages for two bit memory cells. Alternatively, the redundant memory array can be configured as single level cell (SLC) memory cells, e.g., having pages representing one bit memory cells.

In some embodiments, provided are a solid state drive having a flash memory with or without a controller. The solid state drive can have an interface section, such as a translation layer. The firmware can be loaded to a host system, such as a computer, for managing the solid state drive. The interface section can store locations of the memory, together with the redundant memory locations, e.g., the lower bits mirror mapping of the data in the memory. Using the redundant memory, the solid state drive can handle the loss or corruption of data in the current memory, thus improving the reliability of the solid state drive.

In some embodiments, provided is a data storage system with improved data reliability, especially for interrupted writing operations. The data storage system can include a first memory and a second memory. The first memory can include a plurality of multi-level cell (MLC) memory cells, with each MLC memory cell having at least a least significant bit (LSB) and a most significant bit (MSB). For example, the MLC memory cell can be a two-level memory cell, having a LSB and a MSB. The first memory can be configured for page mode data management. The second memory can be configured to store a copy of at least the LSBs, except the MSBs, of the MLC memory cells. For example, in two-bit memory cells, the second memory can be configured to store a copy of all the LSBs of the memory cells in the first memory. The first and second memories can be two portions, e.g., configured to occupy a whole storage memory, of the data storage system. For example, in two bit memory cells, the memory storage of the data storage system can be divided into two memory portions, with the first memory portion having twice the capacity of the second memory portion.

In some embodiments, the first and second memories include two-level MLC memory cells. Alternatively, the first memory include two-level MLC memory cells, and wherein the second memory includes single level cell (SLC) memory cells. The page mode data management can include a storing of the LSBs and MSBs of the MLC memory cells in separate LSB pages and MSB pages, respectively. The first memory can include a NAND gate configuration of the MLC memory cells.

In some embodiments, the first memory is configured from a fabricated memory having a repair portion, and wherein the second memory is formed from the repair portion. The first memory can include a portion of a memory, and wherein the second memory comprises a remaining portion of the memory. The first memory and the second memory can include two separate portions of a memory. The first memory and the second memory are interspersed in a memory.

In some embodiments, the data storage system 900 or 905 can further include a data saving module 970, which can be configured to activate a copy operation from the at least the LSBs of the MLC memory cells of the first memory to the second memory. The data saving module can also be configured to be activated before a writing operation to the first memory.

The data storage system 900 or 905 can further include a data protected module 971, which can be configured to enforce a mutually exclusive writing action to the first and second memories. The data storage system can further include a flag module 972, which can be configured to store a write status of a write operation to the first memory. The flag module is operative to provide an indication that a writing operation is ready to be executed. The flag module is operative to provide an indication that a writing operation is completed.

The data storage system 900 or 905 can further include a restore module 973, which can be configured to copy data from the second memory to the at least the LSBs of the MLC memory cells of the first memory. The restore module can also be configured to be activated during a power up of the data storage module when an interrupted writing operation is detected. The data storage system can further include a controller coupled to the first and second memories, which can be configured to provide a data management system for operating the first and second memories. The controller can allow a stand alone data storage system, with actions performed by the controller.

The data storage system can further include an interface coupled to the first and second memories, which can be configured to receive and send commands from an external processor for managing the first and second memories. The interface can allow coupling the data storage system to a host controller, with actions performed by the host controller.

The data storage system can further include a data management system coupled to the first and second memories, which can be configured to activate a copy operation from the at least the LSBs of the MLC memory cells of the first memory to the second memory before a writing operation to the first memory. The data management system can also be configured to activate a mutually exclusive writing action to the first and second memories. The data management system can also be configured to store a write status of a write operation to the first memory. The data management system can also be configured to copy data from the second memory to the at least the LSBs of the MLC memory cells of the first memory during a power up of the data storage module when an interrupted writing operation is detected. The detection of the interrupted writing operation can be performed using an error detection code.

In some embodiments, provided are methods, including software, firmware or hardware, to reliably control and manage access to a flash memory so that the flash memory appears to a computer operating system as a data storage device. Further, the methods also provide protection against potential data corruption due to interruption in writing or erasing operations.

In some embodiments, provided is a computer-readable storage medium having computer-readable codes for reliably writing new data to the pages of a data storage medium. The reliable writing includes preventing data corruption if the writing operation is interrupted. Data corruption prevention can be performed by a redundant memory for storing lower bits of data, and/or a localization data checking methodology for higher bits.

FIGS. 10A-10C illustrate flowcharts for forming a memory array having a redundant memory portion for preventing data corruption according to some embodiments. In FIG. 10A, operation 1000 forms a redundant memory array for a main memory array, wherein the redundant memory array is configured to contain a mirror image of the lower bits of the memory cells in the main memory array. The redundant memory array can allow the recovering of the lower bits of the memory cells, for example, due to the corruption of these data because of a power interruption. For example, in a two-bit memory cells, e.g., memory cells having a MSB and a LSB, forming four states of 11, 10, 01, and 00, the lower bits of the memory cells include the LSB. In a three-bit memory cells, e.g., memory cells having three bits of MSB, middle bit, and LSB, forming eight states of 111, 110, 101, 100, 011, 010, 001, and 000, the lower bits of the memory cells can include 1 bit of the LSB, or the lower bits of the memory cells can include 2 bits of the LSB and the middle bit. In some embodiments, the lower bits include one or more bits of the memory cells excluding the MSB.

The size of the redundant memory array can be configured to store the lower bits of the memory cells in the main memory array. For example, in a memory array having two bit memory cells, the redundant memory array can be configured to store the LSBs of the memory cells, thus the capacity of the redundant memory array is half of that of the main memory array. The size of the redundant memory array can be dependent on the configuration of the memory cells in the memory array. For example, in a two bit main memory array, the redundant memory array can also be configured as a two bit memory array, meaning the memory cells in the redundant memory array are configured as two bit memory cells. Since the capacity of the redundant memory array is half of that of the main memory array and the memory cells have a similar configuration, the size of the redundant memory array is also half the size of the main memory array. Alternatively, if the redundant memory array is configured as a single bit memory array, meaning the memory cells in the redundant memory array are configured as one bit memory cells, then the size of the redundant memory array is the same as the size of the main memory array.

In some embodiments, the redundant memory array is configured to store all or a portion of the lower bits of the data in the memory cells of the main memory array. In these cases, the capacity and the size of the redundant memory array is configured accordingly. For example, in a three bit main memory array, if only the least significant bits are stored as redundant data, then the capacity of the redundant memory array is one third of the main memory array. If the redundant memory array is also three bit memory array, then the size is also one third. If the redundant memory array is two bit memory array, then the size of the redundant memory array is one half of the main memory array. If the redundant memory array is one bit memory array, then the size of the redundant memory array is the same as the main memory array.

In some embodiments, the redundant memory array can formed by different methods. For example, a memory array can be physically partitioned into a main memory array and a redundant memory array. The redundant memory array can be physically separated from the main memory array, for example, located next to the main memory array or in a different area of a data storage system. Alternatively, a memory array can be separated into two different portions, one for main memory and one for redundant memory. The redundant memory can be interspersed with the main memory, and identified by software such as a look up table and algorithm to separate the two memories.

In FIG. 10B, a memory can be partitioned into a main memory portion and a redundant memory portion. Operation 1020 provides a memory array. The memory array can be in a data storage system, such as a solid state drive. The memory array can include multiple MLC memory cells, e.g., each memory cell contains two or more bits of data. The memory cell can include NAND flash memory configuration.

Operation 1030 partitions the memory array into a first portion, e.g., a main memory portion, and a second portion, e.g., a redundant memory portion. The second portion has smaller a storage capacity than the first portion. The size, e.g., the number of memory cells, of the second portion can be the same or smaller than that of the first portion. For example, if the first and second portions have a same type of memory cells, e.g., a MLC memory cell, then the size of the second portion is smaller than the size of the first portion. Otherwise, the sizes of the two portions can be based on the number of bits required to store the lower bits of the memory cells.

The second portion is configured to contain a mirror image of the lower bits, such as the least significant bits (LSB) of the first portion in a two bit memory array. In other words, the data, e.g., the values stored in the memory cells of the first portion, are redundantly stored in the second portion, except at least the most significant bits of the data. For example, for two bit memory array, the LSBs are redundantly stored in the second portion. For three bit memory array, the LSBs and/or the middle bits are redundantly stored in the second portion. The two portions can be separated, e.g., in two distinct areas of a same memory array, or in two separate memory arrays in a solid state drive. Separate row and column decoders can be used for these two portions.

In FIG. 10C, the two portions can be separated by software, e.g., the two portions are located in one or two memory arrays without a clear boundary. The distinction of the two portions can be performed by software, for example, by looking up a look up table, which can store the addresses of the two portions. Operation 1050 provides a memory array. The memory array can be a single memory array, or can be multiple separate or interlinked memory arrays. Operation 1060 links a first portion of the memory array to a second portion of the memory array so that the second portion contain a mirror image of the lower bits, e.g., at least the least significant bits (LSB), of the first portion. The memory capacity of the second portion is smaller than that of the first portion, since the second portion does not store the MSBs of the data of the first portion.

In some embodiments, the second portion, e.g., the redundant memory of the main memory, can be formed from a repair or spare section of a memory array. During the fabrication of a memory array, an additional portion can also be fabricated. In other words, the fabrication capacity of a memory array, meaning the capacity of the memory array that is designed and then submitted to a fabrication facility for fabrication, can be larger than the rated capacity of the memory array, meaning the capacity of the memory array that is publicized. For example, a 1 Gb memory array can be designed and fabricated as having a 1.1 or 1.2 Gb memory array. The additional portion, e.g., the 0.1 or 0.2 Gb of data, can be used for repair or spare. For example, during fabrication, some memory cells can be defective and not suitable for operation. Memory cells from the repair or spare section can be routed to the memory to replace the defective cells.

In some embodiments, the repair or spare memory section is not completely used, e.g., the defective cells are less than the number of memory cells in the repair or spare section. The extra repair or spare cells can be used for lower bits redundant memory storage, for example, to prevent data corruption during power loss.

FIGS. 11A-11C illustrate other flowcharts for forming a memory array having a redundant memory portion for preventing data corruption according to some embodiments. In FIG. 11A, operation 1100 stores a mirror image of the lower bits, e.g., at least the least significant bits (LSB), of memory cells in a main memory array to a redundant memory array.

In some embodiments, the redundant copy process can be performed in full or in incremental. In a full redundant copy process, the lower bits data from the memory cells in the main memory array are fully copied to the redundant memory array, regardless of whether or not a same data are already stored in the redundant memory array. In an incremental copy process, only changed data are redundantly copied. For example, flags can be set up to identify the memory cells that have been changed since the last redundant copy, and these memory cells can be incrementally copied.

In some embodiments, the data in the main and redundant memory arrays are only allowed to change at different times, e.g., prohibited from being able to change at a same time. For example, during writing operations to the main memory array, the redundant memory array is locked, e.g., not allowed any changes. The write-prohibited characteristic of the redundant memory array during the writing of the main memory array can be performed by software, e.g., preventing data to be changed through conditions or flags, or can be performed by hardware, e.g., separating the main and redundant memory arrays so that writing in one memory array does not affect data in the other memory array. This characteristic can ensure the validity of the lower bits of the data in the redundant memory array, especially during the write operation of the main memory array. For example, during the write operation of higher bits, e.g., MSBs, of the main memory array, a power interruption can potentially corrupt the lower bits data of the main memory array. Since the write operation is prohibited for the redundant memory array, the lower bit redundant data stored in the redundant memory array remain valid, which can be used to recover the corrupted lower bits of data in the main memory array.

Further, during the writing of the redundant memory array, e.g., to store a redundant copy of the lower bits of the data in the main memory array, the main memory array is not allowed to change, so that if power is interrupted during the redundancy writing operation, the original data in the main memory array are not corrupted. Thus during data recovering, the redundancy operation can be repeated without any damages.

In some embodiments, the redundant copy process can be performed before a data modification process, such as a write operation or an erase operation. The redundant copy process can store a copy of the lower bits of the data, thus allowing data recovering if the write operation causes data corruption, such as a power interruption during writing to the MSB pages, which can corrupt data in the lower bits pages. The redundant copy can be full or incremental.

In some embodiments, the redundant copy process can be performed after a data modification process, thus ensuring that the back up data is up-to-date. Further, before the redundant copy process is performed, the data can be checked to see if there are data need updated.

In some embodiments, the redundant copy process can be performed in different ways, such as writing to a different portion of the memory array, or writing to different partition of the memory array, or writing to different memory cells of the memory array.

In FIG. 11B, operation 1120 provides a memory array. The memory array can be in a data storage system, such as a solid state drive. The memory array can include multiple MLC memory cells, e.g., each memory cell contains two or more bits of data. The memory cell can include NAND flash memory configuration. Operation 1130 stores a mirror image of the lower bits, e.g., at least the least significant bits (LSB), of a portion of the memory array to another portion of the memory array.

In FIG. 11C, operation 1150 provides a memory array. Operation 1160 partitions the memory array into a main memory array and a redundant memory array, wherein the redundant memory array has smaller storage capacity than the main memory array. Operation 1170 stores a mirror image of the least significant bits (LSB) of the main memory array to the redundant memory array.

The different portions can be physically separated, and can be addressed to different sections of row and column decoders. The different portions can be interspersed in a memory array, separated by a software program that can identify main memory array and redundant memory array. Writing to the main and the redundant memory arrays can be mutually exclusive, e.g., one memory array is locked or prohibited from being changed when a write or erase operation is performed on the other memory array.

In some embodiments, the memory array, including the main memory and the redundant memory, can be disposed in a data storage system. The data storage system can include a processor for operating the memory array. The data storage system can include an interface portion for interfacing an external processor, such as a processor of a host system, for operating the memory array. The redundant memory can be operated to store a copy of the main memory, in such as way to prevent data corruption, e.g., during a power interruption. Further, the redundant memory can have smaller capacity than the main memory, thus allowing a redundant copy process with less than a mirror image of the whole main memory.

In some embodiments, the redundant storage method for preventing data corruption can be implemented by software, such as programs, e.g., firmware or operating program, in a host system, or programs, e.g., firmware or operating program, in a data storage system. The data storage system can include a processor having loaded a program, e.g., a firmware, to operate the memory array without data corruption due to power interruption. Alternatively, the data storage system can include an interface with the memory array, which can be coupled to a host system. The host system can be loaded with a program, e.g., a firmware for the data storage system, which can allow accessing the data storage system without data corruption due to power loss.

FIGS. 12A-12C illustrate other flowcharts for forming a memory array having a redundant memory portion for preventing data corruption according to some embodiments. In FIG. 12A, operation 1200 configures a memory device so that the lower bits, e.g., at least the least significant bits (LSB), of a portion of the memory array is duplicated to another portion of the memory array. Before the duplication process, the data from the to-be-copy portion is locked or prohibited from being modified. The prohibition can secure the validity of the original data, preventing the data from being changed during the duplication process. Since the extend of the lower bit data corruption can be extensive, e.g., not localized, any data can be potentially affected during an interrupted writing of the MSB pages. The modification prohibition can provide an added security against corruption to the redundant data, thus allowing a recovering of the original data in the event of data corruption.

In addition, the modification prohibition can also be applied to the modification, e.g., writing or erasing, of the data in the memory. For example, during writing to the memory cells, the redundant memory is prohibited from being changed, thus ensuring that the redundant data are not corruptible. The prohibition can allow placing the redundant memory anywhere in the memory array, e.g., a separate portion, a separate device, or within the original memory array. The prohibition also assist in prevent data corruption by ensuring that the redundant data are not corrupted.

In some embodiments, the firmware, e.g., the methods embodied in a program for managing the memory array, can include a saving to a redundant memory before performing a programming, e.g., writing, to the main memory. The data are thus saved, and therefore any data corruption can be recovered from the redundant memory. In addition, the redundant memory is prohibited from being modified during the writing of the main memory, which can provide an insurance that the original data, e.g., the lower bits of the data, have been securely stored during the programming of the higher bits, e.g., the most significant bits of the data.

In some embodiments, the firmware can include a saving to the redundant memory after performing the programming operation. Further, data checking can be performed before saving, potentially saving time by only saving data that have been changed.

In some embodiments, the redundant data saving can be embodied in a program, such as a firmware for operating a data storage system having a memory array. The firmware can be included in the data storage, for example, stored in a non volatile memory which is to be loaded to a processor. The firmware can be provided to a host system, which can interface with the data storage through an interface section for managing the data in the memory array of the data storage system.

In FIG. 12B, the firmware can be supplied to a data storage system. Operation 1220 provides a memory device, such as a data storage system. The data storage system can include a memory array and a processor. Optional memory can be included, for example, to store the firmware, which is to be loaded to the processor for managing the data in the data storage system.

Operation 1230 loads a program, e.g., the firmware, to the processor. The firmware can be configured to run the processor, which duplicate the lower bits, e.g., at least the least significant bits (LSB), of a first portion of the memory array to a second portion of the memory array.

In FIG. 12C, the data storage system may not include a processor, and can rely on the host system for operating the data storage system. Operation 1250 provides a memory device, such as a data storage system. The data storage system can include a memory array. The data storage system can include an interface portion, for coupling the memory array to a processor of a host system. Operation 1260 activates a program, such as a firmware, which can be loaded to the processor of the host system. The firmware can duplicate the lower bits, e.g., at least the least significant bits (LSB), of a first portion of the memory array to a second portion of the memory array. The firmware can provide a data management system for the data storage system, which can include MLC memory such as NAND flash memory. The firmware can improve the reliability and robustness of the data storage system, for example, by eliminating potential data corruption due to interrupted writing to the data storage system.

In some embodiments, provided are methods for managing data in a data storage system that can prevent data corruption due to interrupted writing operations. The methods can be applied to MLC flash memory, such as NAND memory array. The methods can include saving lower bits of data to a redundant memory, which then can be used to restore the data when a data corruption occurs. For example, when writing to MSB pages of an MLC memory array, a power interruption can cause extensive lower bits data corruption, in addition to a localized data corruption of the MSB data. The lower bits data corruption can be recovered from the redundant memory array, and the MSB data corruption can be identified through a monitor of the writing process. The redundant storage is a reduced spatial redundancy, e.g., redundancy only for lower bits data without the MSBs, which does not store a full mirror image of the data, thus can provide storage space saving. The redundant storage methods can be effective in preventing data corruption, in addition to a notification of incomplete writing when a power interruption occurs during a write operation.

FIGS. 13A-13C illustrate flowcharts for preventing data corruption according to some embodiments. An interrupted write operation during writing MSB data can cause data corruption in lower bits data. Since the extend of the lower bits data corruption can be extensive, e.g., previously saved data can be damaged. The previously saved data can include files saved at previous times, which the current write operation does not possess and therefore can be restore, e.g., re-write. The redundant memory, which stored a mirror image of the lower bits data, such as LSB data, can be used to restore the corrupted data. Data corruption from higher bits data, such as MSB data, are localized, which can be isolated and re-write. An advantage of the redundant memory is space saving for the data storage device, that only lower bits of the original data are saved, resulting in a reduced spatial redundant memory configuration, which does not require full mirror image of the original memory. Additionally, the cost of a complete mirror is also reduced, resulting in higher performance.

In FIG. 13A, operation 1300 restores data to the lower bits, e.g., at least the least significant bits, of a first portion of the memory array from a second portion of a memory array. The memory array can include MLC memory cells, such as NAND gate flash memory cells. The memory array can be configured in a page mode memory, with lower bits stored in lower bit pages, and higher bits stored in separate higher bit pages. The first portion of the memory array can be a main memory that will be used to store data. The second portion of the memory array can be a redundant memory, which have previously stored a copy of the lower bits of the data of the main memory. The main and redundant memories can be separated or can be intersperse with each other.

In some embodiments, the memory array can be used in a data storage system, which can be operated by a program such as a firmware. The firmware can be integrated with the data storage, e.g., loaded to a processor resided in the data storage for managing the data storage operation. The firmware can be loaded to a host processor, which can manage the data storage operation through an interface. The firmware can manage the data of the data storage to ensure efficiency and reliability. For example, the firmware can perform the redundant memory saving during a power up, before or after a write or erase operation, or can be performed at any time when redundant data are required. Any redundancy methodology can be used, such as full back up, incremental back up, back up only changed portions, and checking for status before performing back up.

The firmware can also include data verification for writing or erasing operations. For example, a writing operation can include a verification process to ensure that the writing operation is complete and/or the data are written properly. Flags can be used to indicate the progression of the writing operation. For example, before writing to a memory cell, the flag can be set to a not-yet-written state. During writing, the flag can be set to currently-writing state. And after complete writing and verifying, the flag can be set to complete state. Other flag state configurations can be used, such as the omission of the currently-writing state.

The firmware can also include data restoration operations. During a power up of the data storage, the firmware can perform a check to verify the validity of the data stored in the memory array of the data storage. For example, the data can be checked to determine whether any pages are corrupted as a result of power loss. The data checking can be based on flag conditions, for example, to identify an interrupted write operation through the not-yet-written or the currently-writing state. The data checking can be based on error detection code of the data, which is typically associated with each page of data, to verify that there is no data corruption, for example, due to a previously interrupted write operation. If the data is corrupted, or if the previously writing operation is interrupted, the firmware can perform the data restoration. Data from the redundant memory can be copied to the lower bits data of the main memory. The copy process can be a full copy process, e.g., all data are copied regardless of status. The copy process can be a selective copy process, e.g., only corrupted, or potentially corrupted data in the main memory are being restored from the data of the redundant memory.

The higher bits data corruption can be addressed by a localization scheme, e.g., the data corruption is identified and the data are not used until re-processed, e.g., re-written. For example, flags can be used to identify the MSB data that have not been written properly in the last write operation. Since the writing of MSB pages are corruptible locally, e.g., only currently written data are corrupted and previously written data are not affected, recovering can be performed by identifying the corrupted data and re-write these data.

In some embodiments, the lower bits recovery can be selective, e.g., data recovery is performed for data that are identified as damaged. In FIG. 13B, operation 1320 identifies a damage zone of a main memory array. Operation 1330 restores data from a redundant memory array to the lower bits, e.g., at least the least significant bits (LSB) of the main memory array.

In FIG. 13C, operation 1350 powers up a memory array. The memory array can include a main memory array and a redundant memory array, and the redundant memory array has smaller storage capacity than the main memory array, e.g., capable of storing one or more lower bits of the data in the main memory array. The MSB data are not stored in the redundant memory array. Operation 1360 identifies corrupt pages. Operation 1370 restores data, if there are corrupt pages, from the redundant memory array to the least significant bits (LSB) of the main memory array.

In some embodiments, provided is a method to managing a memory, e.g., a flash memory in a data storage system or data storage module. The method can include configuring a first memory and a second memory from the memory in the data storage system. The first memory can include a plurality of multi-level cell (MLC) memory cells, which can include at least a least significant bit (LSB) and a most significant bit (MSB). The method can include copying first data from the first memory to the second memory, with the first data include at least LSBs except MSBs of the MLC memory cells. For example, for two-bit memory cells, the first data include the LSBs. The second memory forms a redundant image for the first memory. The method can include writing second data to the MSBs of the MLC memory cells. The first and second memories can be two portions, e.g., configured to occupy a whole storage memory, of the data storage system. For example, in two bit memory cells, the memory storage of the data storage system can be divided into two memory portions, with the first memory portion having twice the capacity of the second memory portion.

In some embodiments, the first and second memories include two-level MLC memory cells. Alternatively, the first memory include two-level MLC memory cells, and wherein the second memory includes single level cell (SLC) memory cells. The page mode data management can include a storing of the LSBs and MSBs of the MLC memory cells in separate LSB pages and MSB pages, respectively. The first memory can include a NAND gate configuration of the MLC memory cells.

In some embodiments, the first memory is configured from a fabricated memory having a repair portion, and wherein the second memory is formed from the repair portion. The first memory can include a portion of a memory, and wherein the second memory comprises a remaining portion of the memory. The first memory and the second memory can include two separate portions of a memory. The first memory and the second memory are interspersed in a memory.

The method can further include protecting data in the second memory to prevent from being changed when performing the writing operation to the first memory. The data of the first and second memories can be configured to have a mutually exclusive writing action, e.g., writing to one memory is prohibited when writing operation to the other memory is performed.

The method can further include storing a write status of the writing operation to the first memory. The writing status can indicate that a writing operation is ready to be executed, or that a writing operation is completed.

The method can further include restoring data from the second memory to the at least the LSBs except the MSBs of the MLC memory cells of the first memory, which can be activated during a power up of the data storage module when a interrupted writing operation is detected. The detection of the interrupted writing operation can be performed using an error detection code.

In some embodiments, provided is a machine readable storage, having stored thereon a computer program having a plurality of code sections for causing a machine to perform the various steps and/or implement the components and/or structures disclosed herein. In some embodiments, the present invention may also be embodied in a machine or computer readable format, e.g., an appropriately programmed computer, a software program written in any of a variety of programming languages. The software program would be written to carry out various functional operations of the present invention. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g. a processor.

In some embodiments, the methods can be realized in hardware, software, or a combination of hardware and software. The methods can be realized in a centralized fashion in a data processing system, such as a computer system or in a distributed fashion where different elements are spread across several interconnected computer systems. Any kind of computer system or other apparatus adapted for carrying out the methods described herein can be used. A typical combination of hardware and software can be a general-purpose computer system with a computer program that can control the computer system so that the computer system can perform the methods. The methods also can be embedded in a computer program product, which includes the features allowing the implementation of the methods, and which when loaded in a computer system, can perform the methods.

The terms "computer program", "software", "application", variants and/or combinations thereof, in the context of the present specification, mean any expression, in any language, code or notation, of a set of instructions intended to cause a system having an information processing capability to perform a particular function either directly. The functions can include a conversion to another language, code or notation, or a reproduction in a different material form. For example, a computer program can include a subroutine, a function, a procedure, an object method, an object implementation, an executable application, an applet, a servlet, a source code, an object code, a shared library/dynamic load library and/or other sequence of instructions designed for execution on a data processing system, such as a computer.

In some embodiments, the methods can be implemented using a data processing system, such as a general purpose computer system. A general purpose computer system can include a graphical display monitor with a graphics screen for the display of graphical and textual information, a keyboard for textual entry of information, a mouse for the entry of graphical data, and a computer processor. In some embodiments, the computer processor can contain program code to implement the methods. Other devices, such as a light pen (not shown), can be substituted for the mouse. This general purpose computer may be one of the many types well known in the art, such as a mainframe computer, a minicomputer, a workstation, or a personal computer.

Figure 14:
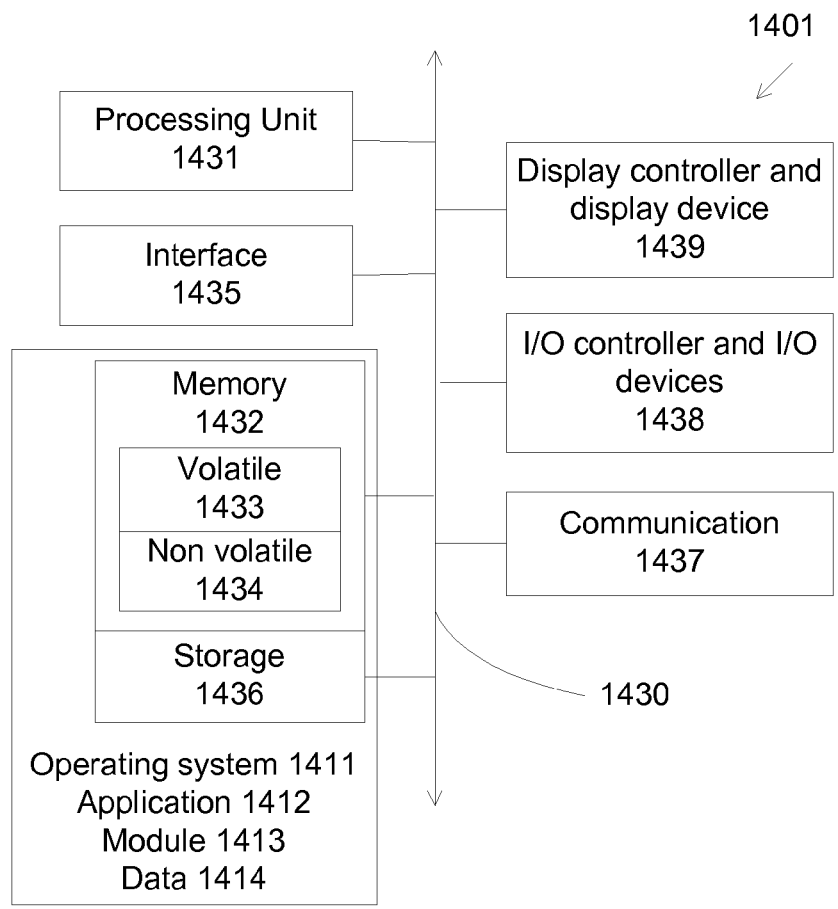
FIG. 14 illustrates a computing environment according to some embodiments.

FIG. 14 illustrates a computing environment according to some embodiments. An exemplary environment 1400 for implementing various aspects of the invention includes a computer 1401, comprising a processing unit 1431, a system memory 1432, and a system bus 1430. The processing unit 1431 can be any of various available processors, such as single microprocessor, dual microprocessors or other multi-processor architectures. The system bus 1430 can be any type of bus structures or architectures, such as 12-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), or Small Computer Systems Interface (SCST).

The system memory 1432 can include volatile memory 1433 and nonvolatile memory 1434. Nonvolatile memory 1434 can include read only memory (ROM), programmable ROM (PROM), electrically programmable ROM (EPROM), electrically erasable ROM (EEPROM), or flash memory. Volatile memory 1433, can include random access memory (RAM), synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), or direct Rambus RAM (DRRAM).

Computer 1401 also includes storage media 1436, such as removable/nonremovable, volatile/nonvolatile disk storage, magnetic disk drive, floppy disk drive, tape drive, Jaz drive, Zip drive, LS-100 drive, flash memory card, memory stick, optical disk drive such as a compact disk ROM device (CD-ROM), CD recordable drive (CD-R Drive), CD rewritable drive (CD-RW Drive) or a digital versatile disk ROM drive (DVD-ROM). A removable or non-removable interface 1435 can be used to facilitate connection.

The computer system 1401 further can include software to operate in environment 1400, such as an operating system 1411, system applications 1412, program modules 1413 and program data 1414, which are stored either in system memory 1432 or on disk storage 1436. Various operating systems or combinations of operating systems can be used.

Input devices 1422 can be used to enter commands or data, and can include a pointing device such as a mouse, trackball, stylus, touch pad, keyboard, microphone, joystick, game pad, satellite dish, scanner, TV tuner card, sound card, digital camera, digital video camera, web camera, and the like, connected through interface ports 1438. Interface ports 1438 can include a serial port, a parallel port, a game port, a universal serial bus (USB), and a 1394 bus. The interface ports 1438 can also accommodate output devices 1421. For example, a USB port may be used to provide input to computer 1401 and to output information from computer 1401 to an output device 1421. Output adapter 1439, such as video or sound cards, is provided to connect to some output devices such as monitors, speakers, and printers.

Computer 1401 can operate in a networked environment with remote computers 1424. The remote computers 1424, shown with a memory storage device 1425, can be a personal computer, a server, a router, a network PC, a workstation, a microprocessor based appliance, a peer device or other common network node and the like, and typically includes many or all of the elements described relative to computer 1401. Remote computers 1424 can be connected to computer 1401 through a network interface 1423 and communication connection 1437, with wire or wireless connections. Network interface 1423 can be communication networks such as local-area networks (LAN), wide area networks (WAN) or wireless connection networks. LAN technologies include Fiber Distributed Data Interface (FDDI), Copper Distributed Data Interface (CDDI), Ethernet/IEEE 1202.3, Token Ring/IEEE 1202.5 and the like. WAN technologies include, but are not limited to, point-to-point links, circuit switching networks like Integrated Services Digital Networks (ISDN) and variations thereon, packet switching networks, and Digital Subscriber Lines (DSL).

Figure 15:
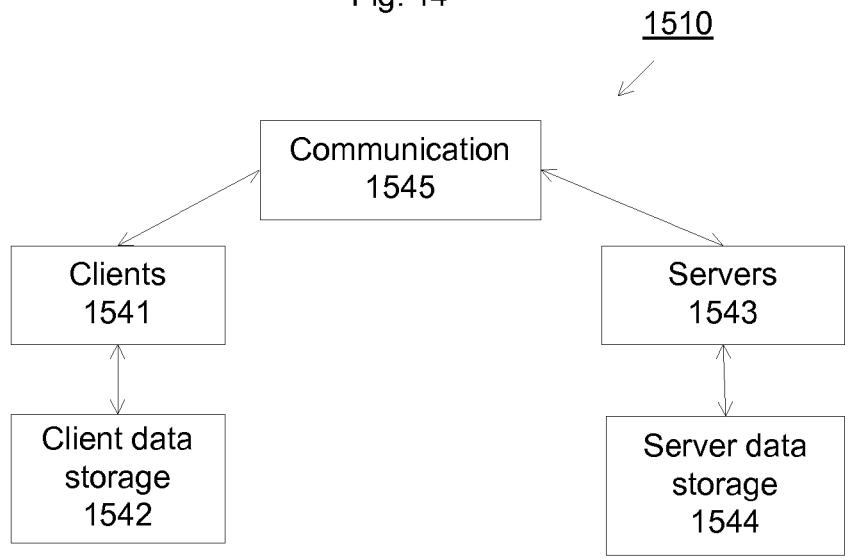
FIG. 15 is a schematic block diagram of a sample computing environment 1800 with which the present invention can interact.

FIG. 15 is a schematic block diagram of a sample computing environment 1500 with which the present invention can interact. The system 1540 includes a plurality of client systems 1541. The system 1540 also includes a plurality of servers 1543. The servers 1543 can be used to employ the present invention. The system 1540 includes a communication network 1545 to facilitate communications between the clients 1541 and the servers 1543. Client data storage 1542, connected to client system 1541, can store information locally. Similarly, the server 1543 can include server data storages 1544.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

What is claimed is:

1. A method of managing a memory, the method comprising
configuring a first memory and a second memory,
wherein the first memory and the second memory each comprises a plurality of multi-level cell (MLC) memory cells,
wherein each MLC memory cell comprises at least a least significant bit (LSB) and a most significant bit (MSB);
copying first data from the first memory to the second memory,
wherein the first data comprise multiple LSB data and exclude all of the MSB data of the MLC memory cells of the first memory,
wherein a first portion of the first data is copied to one or more LSBs of the MLC memory cells of the second memory,
wherein a second portion of the first data is copied to one or more MSBs of the MLC memory cells of the second memory;
writing second data to at least a MSB of the MLC memory cells of the first memory after copying the first data.

2. The method as in claim 1 wherein the first memory is configured from a fabricated memory having a main memory portion and a repair portion, wherein the repair portion is configured to replace a portion of the main memory portion that are defective in the fabrication process, and wherein the second memory is formed from the repair portion.

3. The method as in claim 1 wherein the first memory comprises a portion of the memory, and wherein the second memory comprises a remaining portion of the memory.

4. The method as in claim 1 further comprising
protecting data in the second memory to prevent the second memory from being changed when performing the writing operation to the first memory.

5. The method as in claim 1 further comprising
storing a write status of the writing operation to the first memory.

6. The method as in claim 1 further comprising
restoring data from the second memory to the multiple LSB data and excluding all of the MSB data of the MLC memory cells of the first memory,
wherein the restoring operation is performed during a power up of a data storage module when an interrupted writing operation is detected.

7. A data storage system comprising
a first memory,
wherein the first memory comprises a plurality of first multi-level cell (MLC) memory cells,
wherein each first MLC memory cell comprises at least a least significant bit (LSB) and a most significant bit (MSB),
wherein the first memory is configured for page mode data management;
a second memory,
wherein the second memory comprises a plurality of second multi-level cell (MLC) memory cells,
wherein each second MLC memory cell comprises at least a least significant bit (LSB) and a most significant bit (MSB),
wherein the second memory is configured to store a copy of first data of the first memory, wherein the first data comprise multiple LSB data and exclude all of the MSB data of the first MLC memory cells, wherein a first portion of the first data is configured to be stored in one or more LSBs of the second MLC memory cells, wherein a second portion of the first data is configured to be stored in one or more MSBs of the second MLC memory cells.

8. The data storage system as in claim 7 wherein the page mode data management comprises a storing of the LSBs and MSBs of the MLC memory cells in separate LSB pages and MSB pages, respectively.

9. The data storage system as in claim 7 wherein the first memory is configured from a fabricated memory having a main memory portion and a repair portion, wherein the repair portion is configured to replace a portion of the main memory portion that are defective in the fabrication process, and wherein the second memory is formed from the repair portion.

10. The data storage system as in claim 7 further comprising
a data saving module, wherein the data saving module is configured to activate a copy operation from the multiple LSB data of the MLC memory cells of the first memory to the second memory,
wherein the data saving module is configured to be activated before an writing operation to the first memory.

11. The data storage system as in claim 7 further comprising
a data protected module, wherein the data protected module is configured to enforce a mutually exclusive writing action to the first and second memories.

12. The data storage system as in claim 7 further comprising
a flag module, wherein the flag module is configured to store a write status of a write operation to the first memory.

13. The data storage system as in claim 7 further comprising
a restore module, wherein the restore module is configured to copy data from the second memory to the multiple LSBs of the MLC memory cells of the first memory, wherein the restore module is configured to be activated during a power up of a data storage module when an interrupted writing operation is detected.

14. The data storage system as in claim 7 further comprising
a controller coupled to the first and second memories, wherein the controller is configured to provide a data management system for operating the first and second memories.

15. The data storage system as in claim 7 further comprising
an interface coupled to the first and second memories, wherein the interface is configured to receive and send commands from an external processor for managing the first and second memories.

16. The data storage system as in claim 7 further comprising
a data management system coupled to the first and second memories,
wherein the data management system is configured to activate a copy operation from the multiple LSB data of the MLC memory cells of the first memory to the second memory before a writing operation to the first memory,
wherein the data management system is configured to activate a mutually exclusive writing action to the first and second memories,
wherein the data management system is configured to store a write status of the write operation to the first memory,
wherein the data management system is configured to copy data from the second memory to the multiple LSBs of the MLC memory cells of the first memory during a power up of a data storage module when an interrupted writing operation is detected.

17. A non-transitory computer readable storage medium having a computer readable code executed by a processor for improving data reliability in a data storage system, wherein the data storage system comprises a first memory and a second memory, wherein the first memory and the second memory each comprises a plurality of multi-level cell (MLC) memory cells, wherein each MLC memory cell comprises at least a least significant bit (LSB) and a most significant bit (MSB), the computer readable code comprising:
program code for copying first data from the first memory to the second memory,
wherein the first data comprise multiple LSB data and exclude all of the MSB data of the MLC memory cells of the first memory,
wherein a first portion of the first data is configured to be copied to one or more LSBs of the MLC memory cells of the second memory,
wherein a second portion of the first data is configured to be copied to one or more MSBs of the MLC memory cells of the second memory;
program code for writing second data to at least a MSB of the MLC memory cells.

18. The computer readable storage medium as in claim 17, wherein the computer readable code further comprising
program code for protecting data in the second memory to prevent the second memory from being changed when performing the writing operation to the first memory.

19. The computer readable storage medium as in claim 17, wherein the computer readable code further comprising
program code for restoring data from the second memory to the multiple LSB data and excluding all of the MSB data of the MLC memory cells of the first memory, wherein a restoring operation is performed during a power up of the data storage module when an interrupted writing operation is detected.

20. The computer readable storage medium as in claim 17, wherein the computer readable code further comprising
program code for copying the first data from the first memory to a repair portion,
wherein the first memory is configured from a fabricated memory having a main memory portion and the repair portion, wherein the repair portion is configured to replace a portion of the main memory portion that are defective in the fabrication process.

* * * * *